(12) United States Patent
Mitani et al.

(10) Patent No.: US 8,604,579 B2
(45) Date of Patent: Dec. 10, 2013

(54) SEMICONDUCTOR DEVICE, AND METHOD FOR MANUFACTURING SAME

(75) Inventors: Masahiro Mitani, Osaka (JP); Yutaka Takafuji, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 215 days.

(21) Appl. No.: 13/132,600

(22) PCT Filed: Aug. 25, 2009

(86) PCT No.: PCT/JP2009/004100
§ 371 (c)(1),
(2), (4) Date: Jun. 9, 2011

(87) PCT Pub. No.: WO2010/064343
PCT Pub. Date: Jun. 10, 2010

(65) Prior Publication Data
US 2011/0241006 A1 Oct. 6, 2011

(30) Foreign Application Priority Data
Dec. 5, 2008 (JP) .................................. 2008-311321

(51) Int. Cl.
*H01L 27/146* (2006.01)
(52) U.S. Cl.
USPC ...................... 257/435; 257/49; 257/E31.122
(58) Field of Classification Search
USPC ................... 257/49, 66, 70, 75, 435, E31.122
See application file for complete search history.

(56) References Cited

U.S. PATENT DOCUMENTS

| 7,102,164 | B2 * | 9/2006 | Zhang | 257/59 |
| 7,671,370 | B2 * | 3/2010 | Miyake et al. | 257/72 |
| 2002/0171086 | A1 * | 11/2002 | Miyajima et al. | 257/72 |
| 2003/0048395 | A1 | 3/2003 | Yasui | |
| 2005/0271833 | A1 * | 12/2005 | Matsumori et al. | 428/1.25 |
| 2006/0163583 | A1 * | 7/2006 | Jiroku | 257/66 |
| 2007/0117239 | A1 * | 5/2007 | Ishi | 438/30 |
| 2007/0159656 | A1 * | 7/2007 | Kishimoto | 358/3.06 |
| 2010/0053486 | A1 * | 3/2010 | Shim et al. | 349/39 |
| 2011/0068343 | A1 * | 3/2011 | Tanabe | 257/66 |

FOREIGN PATENT DOCUMENTS

| JP | 2001-284594 A | 10/2001 |
| JP | 2003-152193 A | 5/2003 |
| JP | 2006-203065 A | 8/2006 |
| JP | 2008-158272 A | 7/2008 |
| JP | 2008-241511 A | 10/2008 |
| JP | 2008-282896 A | 11/2008 |
| JP | 2008-287061 A | 11/2008 |
| JP | 2008-300630 A | 12/2008 |
| JP | 2009-10125 A | 1/2009 |

OTHER PUBLICATIONS

International Search Report (ISR) issued in PCT/JP2009/004100 (International application) mailed in Nov. 2009 for Examiner consideration, citing U.S. Patent Application Publication Nos. 1-2 and Foreign Patent document Nos. 2-5 listed above.

* cited by examiner

*Primary Examiner* — Eduardo A Rodela
(74) *Attorney, Agent, or Firm* — Chen Yoshimura LLP

(57) ABSTRACT

Provided is a liquid crystal display device (1) comprising a substrate (2), a base coating film (3) disposed on the substrate (2), a base insulating film (4) disposed on the base coating film (3), and a semiconductor film (20) disposed on the base insulating film (4) and made of a polysilicon film. Below the semiconductor film (20), a light-shielding film (28) is formed, which is embedded in the base coating film (3).

6 Claims, 15 Drawing Sheets

(a)

(b)

(a)

Scanning direction (b)

(a)

(b)

(a)

Scanning direction (b)

(a)

Scanning direction (b)

SEMICONDUCTOR DEVICE, AND METHOD FOR MANUFACTURING SAME

TECHNICAL FIELD

The present invention relates to a semiconductor device such as a liquid crystal display device, and to a method for manufacturing the same.

BACKGROUND ART

For a semiconductor device such as a liquid crystal display device, a polysilicon film that is obtained by poly-crystallizing a non-crystalline silicon film such as an amorphous silicon film is widely used as a semiconductor film.

Further, in recent years, for a liquid crystal display device equipped with semiconductor elements such as thin film transistors (TFTs) and optical sensors such as photodiodes, the above-mentioned polysilicon film has been used as the semiconductor films for the TFTs and the optical sensors.

As a method for poly-crystallizing an amorphous silicon film, a method of poly-crystallizing an amorphous silicon film to change to a polysilicon film by irradiating the amorphous silicon film with laser light has been suggested. A pulse laser such as an excimer laser is commonly used as the laser, and by irradiating an amorphous silicon film with linear-shaped laser light for multiple times, a polysilicon film of an approximate crystal grain size of 0.5 μm can be formed. In recent years, technologies such as poly-crystallization by CW laser or quasi-CW laser, and the SLS method using pulse laser are also available, and it is possible to grow long and thin shaped crystal with the length of several tens of μm, which expands in the scanning direction of laser light (in other words, lateral growth).

Moreover, in a liquid crystal display device equipped with semiconductor elements such as TFTs and optical sensors, in order to prevent malfunction of the semiconductor device by preventing the increase in off-currents caused by the irradiated light from a backlight entering to a channel region of a polysilicon film that constitutes the semiconductor element, a light-shielding film for controlling the light entering to the channel region of the polysilicon film is commonly formed.

More specifically, as shown in FIG. 41(b), a liquid crystal display device that includes a transparent insulating substrate 61 such as a glass substrate, a light-shielding film 62 made of a metal such as Mo formed over the insulating substrate 61, an insulating film 63 made of silicon oxide film or the like formed over the light-shielding film 62, and a polysilicon film 64 formed by irradiating an amorphous silicon film 69 formed over the insulating film 63 with laser light L to poly-crystallize the amorphous silicon film 69 is disclosed (for example, refer to Patent Document 1).

RELATED ART DOCUMENTS

Patent Documents

Patent Document 1: Japanese Patent Application Laid-Open Publication No. 2001-284594

SUMMARY OF THE INVENTION

Problems to be Solved by the Invention

However, in cases of a poly-crystallization method using laser, because crystal growth occurs by expanding an amorphous silicon film in the scanning direction of laser light L while the amorphous silicon film is in a completely melted state by the laser light L (in other words, in a completely liquefied state), it is difficult for crystal to grow in the scanning direction of the laser light L if a light-shielding film 62 is formed below a polysilicon film 64. Therefore, when the melted amorphous silicon film is solidified, as shown in FIGS. 41(a) and 41(b), the film thickness of the polysilicon film 64 becomes extremely thin at the step part 65 formed on the polysilicon film 64 in the area corresponding to an edge of the light-shielding film 62, possibly creating step disconnections 66. If the step disconnection 66 progresses because of the increased laser power, the film could be peeled off. Furthermore, as shown in FIGS. 41(a) and 41(b), at the step part 67 formed on the polysilicon film 64 in the area corresponding to an edge of the light-shielding film 62, a bulge 68 could occur because the film thickness of the polysilicon film 64 increases, and step disconnection 66 could also occur because the crystallization does not progress sufficiently. And, if such step disconnection 66 and film peel-off occur, a pattern chipping and the like could occur due to the step disconnection 66 and the film peel-off 66 when a semiconductor film is formed by patterning a polysilicon film 64 by a photolithography method or the like. Additionally, when a resist is applied on the patterned polysilicon film 64 by a spin coating method or the like, the coating could become uneven due to step disconnection 66, film peel-off and the bulge 68. As a result, lowering of the yield of the liquid crystal display device has existed as a problem.

The present invention was devised in light of the above-mentioned problems, and an object is to provide a semiconductor device having a light-shielding film with a high yield, which can prevent step disconnection and film peel-off, and a manufacturing method of the same.

Means for Solving the Problems

In order to achieve the above-mentioned object, a semiconductor device of the present invention includes a substrate, a base coating film disposed over the substrate, an insulating film disposed over the base coating film, and a semiconductor film disposed over the insulating film. Below the semiconductor film, a light-shielding film is formed, which is embedded in the base coating film.

According to this structure, when a polysilicon film or a microcrystalline silicon film that constitutes a semiconductor film is formed by irradiating a non-crystalline silicon film with laser light to poly-crystallize or micro-crystallize it, no step is formed on the semiconductor film in the areas corresponding to edges of the light-shielding film even when the light-shielding film is formed below the semiconductor film. Therefore, even when a polysilicon film is formed by completely melting a non-crystalline silicon film by laser light to perform a lateral crystal growth expanding in the scanning direction of the laser light, for example, it is possible to prevent step disconnection and film peel-off on the polysilicon film with certainty. As a result, it becomes possible to provide a semiconductor device that can prevent lowering of the yield.

Moreover, in a semiconductor device of the present invention, a concave part for embedding a light-shielding film may be formed in the base coating film, wherein the light-shielding film may be embedded in the concave part so that a surface of the light-shielding film on the semiconductor film side and a surface of the base coating film on the semiconductor film side are substantially flush with each other.

According to this structure, it becomes possible to embed the light-shielding film in the base coating film with a simple structure, and to surely prevent steps from forming on the semiconductor film in the areas corresponding to edges of the light-shielding film.

Moreover, in a semiconductor device of the present invention, a concave part may be formed in a tapered cross-sectional shape.

According to this structure, because the coverage of a light-shielding film in a concave part is improved, it becomes possible to embed the light-shielding film in the concave part with certainty.

In a semiconductor device of the present invention, a light-shielding film may also be embedded in a base coating film so that a surface of the light-shielding film on the semiconductor film side and a surface of the base coating film on the semiconductor film side are substantially flush with each other.

According to this structure, it is possible to surely prevent steps from forming on the semiconductor film in the areas corresponding to edges of the light-shielding film.

Additionally, in a semiconductor device of the present invention, the base coating film may be made of a plurality of layers.

According to this structure, there is no need to form a concave part in the base coating film, and the light-shielding film can be embedded in the base coating film with a simple structure.

Furthermore, in a semiconductor device of the present invention, the semiconductor film may be a laterally-grown polysilicon film.

According to this structure, it is possible to improve the characteristics of the TFT, and to surely prevent step disconnection that is specific to laterally-grown crystal.

In a semiconductor device of the present invention, the semiconductor film may constitute an optical sensor.

According to this arrangement, it is possible to prevent lowering of the yield for a semiconductor device having an optical sensor that receives reflected light from an object and detects the existence of the object based on the intensity of the reflected light, as well as a light-shielding film for preventing other light (for example, irradiated light from a backlight) from entering to the optical sensor, for example.

Moreover, in a semiconductor device of the present invention, the semiconductor film may constitute the active layer of a thin film transistor.

According to this arrangement, it is possible to prevent lowering of the yield for the semiconductor device equipped with the light-shielding film for preventing the increase in off-currents caused by light entering to the channel region of the semiconductor film by preventing light (for example, irradiated light from a backlight) from entering to the semiconductor film that constitutes the active layer of the thin film transistor, for example.

In a semiconductor device of the present invention, the gate electrode for the thin film transistor may be embedded in the base coating film.

According to this arrangement, because the gate electrode and the light-shielding film can be formed in the same manufacturing step, the number of the manufacturing steps can be reduced.

A method for manufacturing a semiconductor device of the present invention at least includes a base coating film formation step in which a base coating film is formed over a substrate, a light-shielding film formation step in which a light-shielding film is formed such that it is embedded in the base coating film, an insulating film formation step in which an insulating film is formed over the base coating film so as to cover the light-shielding film, a non-crystalline silicon film formation step in which a non-crystalline silicon film is formed over the insulating film in an area above the light-shielding film, and a polysilicon film formation step in which a polysilicon film is formed by scanning a non-crystalline silicon film with laser light to poly-crystallize the non-crystalline silicon film.

According to this arrangement, when the polysilicon film that constitutes the semiconductor film is formed by irradiating the silicon film with laser light for poly-crystallization, no step is formed on the polysilicon film in areas corresponding to edges of the light-shielding film even when the light-shielding film is formed below the polysilicon film. Therefore, even when a polysilicon film is formed by completely melting a silicon film by laser light to perform a lateral crystal growth expanding in the scanning direction of the laser light, it is possible to prevent step disconnection and film peel-off on the polysilicon film with certainty. As a result, it becomes possible to prevent lowering of the yield for the semiconductor device.

Moreover, for a method for manufacturing a semiconductor device of the present invention, a concave part for embedding a light-shielding film may be formed in a base coating film in the base coating film formation step, and a light-shielding film may be embedded in the concave part in the light-shielding film formation step so that a surface of the light-shielding film on the polysilicon film side and a surface of the base coating film on the polysilicon film side are substantially flush with each other.

According to this arrangement, with a simple method, it becomes possible to embed a light-shielding film in a base coating film, and to surely prevent a step from forming on a polysilicon film in areas corresponding to edges of the light-shielding film.

Further, in a method for manufacturing a semiconductor device of the present invention, a light-shielding film formation step includes forming the light-shielding film over the base coating film, forming a base coating film again over a substrate so as to cover the light-shielding film, forming a resist on the base coating film, performing exposure from a surface of the substrate opposite to the base coating film side using the light-shielding film as a mask and then performing development to remove the part of the resist located above the aforementioned light-shielding film, and embedding the light-shielding film in the base coating film by etching the base coating film using the resist as a mask so that a surface of the light-shielding film on the polysilicon film side and a surface of the base coating film on the polysilicon side are substantially flush with each other.

According to this arrangement, it is possible to surely prevent a step from forming on a polysilicon film in the area corresponding to the edges of a light-shielding film.

Furthermore, as for a method for manufacturing a semiconductor device of the present invention, a resist may be a negative-type resist.

According to this arrangement, by performing exposure from a surface of the substrate opposite to the base coating film side using the light-shielding film as a mask, it is possible to remove the base coating film, which was formed again on the light-shielding film, by etching after exposing and developing it in a self-alignment manner. Therefore, the embedded light-shielding film can be formed at a specific position with high accuracy.

As for a method for manufacturing a semiconductor device of the present invention, etching may be wet etching.

According to this arrangement, because etching progresses isotropically, it becomes possible to embed a light-shielding film in a base coating film so that a surface of the light-shielding film on the polysilicon film side and a surface of the base coating film on the polysilicon film side are substantially flush with each other, with a simple method.

Furthermore, in a method for manufacturing a semiconductor device of the present invention, a polysilicon film may constitute an optical sensor.

According to this arrangement, it is possible to prevent lowering of the yield for a method for manufacturing a semiconductor device having a light-shielding film for preventing other light (for example, irradiated light from a backlight) from entering to an optical sensor that receives reflected light from an object and detects the existence of the object based on the intensity of the reflected light, for example.

Moreover, as for a method for manufacturing a semiconductor device of the present invention, a polysilicon film may constitute the active layer of a thin film transistor.

According to this arrangement, it is possible to prevent lowering of the yield for a method for manufacturing a semiconductor device having a light-shielding film for preventing the increase in off-currents caused by light entering to a channel region of the polysilicon film by preventing light (for example, irradiated light from a backlight) from entering to the polysilicon film that constitutes the active layer of the thin film transistor.

Furthermore, a method for manufacturing a semiconductor device of the present invention may further include forming a gate electrode in which a gate electrode for a thin film transistor is formed such that it is embedded in a base coating film, wherein forming of a light-shielding film and forming of a gate electrode may be performed at the same time.

According to this arrangement, because it is possible to form a gate electrode and a light-shielding film in the same manufacturing step, the number of the manufacturing steps can be reduced.

Additionally, in a method for manufacturing a semiconductor device of the present invention, laser light may be CW laser light or quasi-CW laser light.

According to this structure, a lateral crystal growth can occur on a silicon film in the scanning direction of laser light L with a simple method and with certainty.

Effects of the Invention

According to the present invention, it is possible to prevent step disconnection and film peel-off on a polysilicon film with certainty when the polysilicon film that constitutes a semiconductor film is formed by irradiating a silicon film with laser light for poly-crystallization. Therefore, it is possible to provide a semiconductor device that can prevent lowering of the yield.

DETAILED DESCRIPTION OF EMBODIMENTS

Embodiments of the present invention will be described in detail as follows with reference to the figures. The present invention is not limited to the following embodiments.

Embodiment 1

Figure 2:
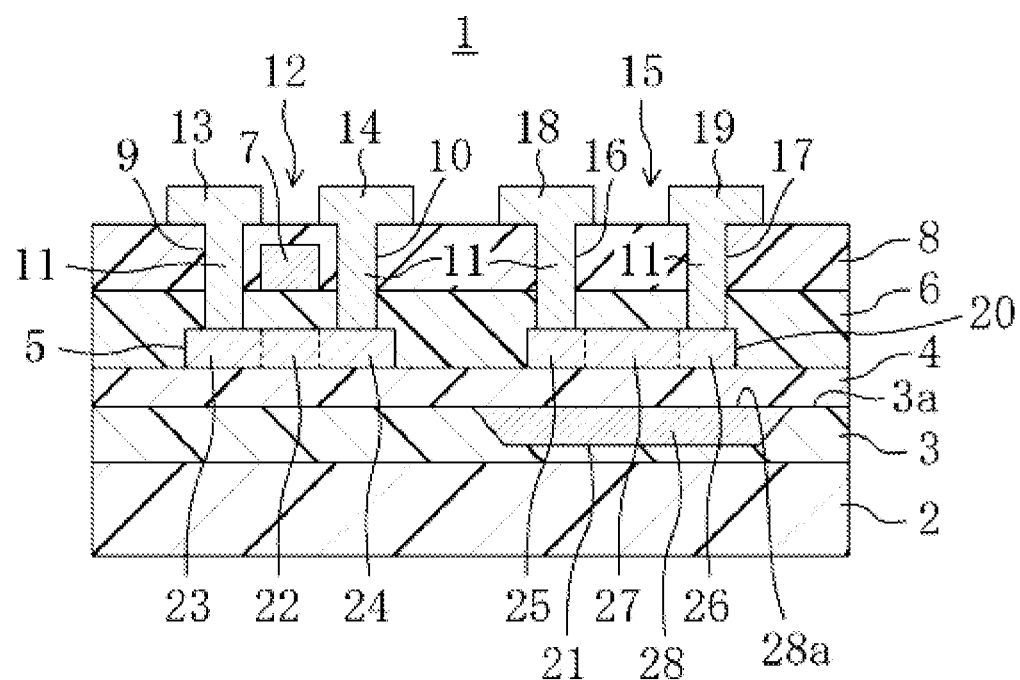
FIG. 2 is a cross-sectional view showing a schematic structure of a TFT substrate in a semiconductor device according to Embodiment 1 of the present invention.
Figure 3:
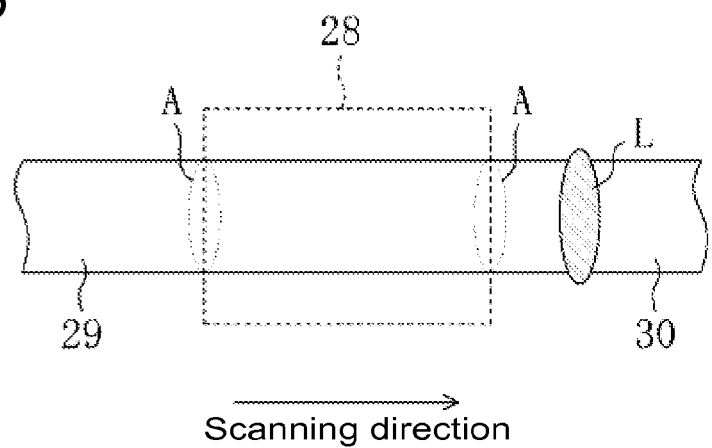
FIGS. 3(a) and 3(b) are views showing a polysilicon film formation step in a semiconductor device of Embodiment 1 of the present invention.
Figure 3:
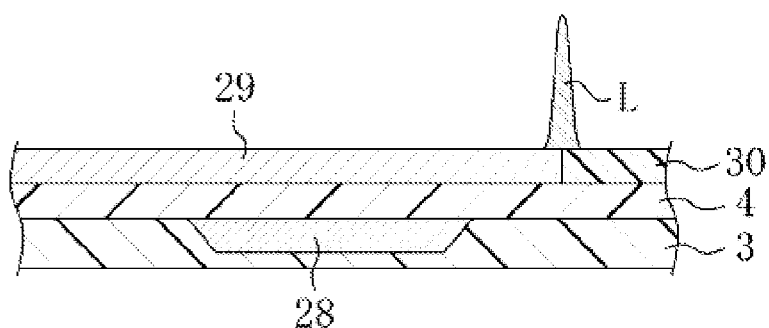

FIG. 1(a) is a schematic view showing a structure of a semiconductor device of Embodiment 1 of the present invention, and FIG. 1(b) is a cross-sectional view showing a structure of a semiconductor device of Embodiment 1 of the present invention. FIG. 2 is a cross-sectional view showing a schematic structure of a TFT substrate in a semiconductor device of Embodiment 1 of the present invention. FIGS. 3(a) and 3(b) are views showing a polysilicon film formation step in a semiconductor device of Embodiment 1 of the present invention. Furthermore, in the present embodiment, a TFT that is an active element and a photodiode that is a optical sensor will be explained as examples of a semiconductor element, and a liquid crystal display device including a TFT and a photodiode will be explained as a semiconductor device.

As shown in FIGS. 1(a) and 1(b), a liquid crystal display device 50 includes a TFT substrate 1 that is an element substrate, an opposite substrate 35 placed so as to face the TFT substrate 1, and a liquid crystal layer 45 that is a display medium layer formed between the opposite substrate 35 and the TFT substrate 1. Moreover, as shown in FIG. 1(b), a backlight 46 is formed on the rear surface side of the liquid crystal display device 50 (the lower side in FIG. 1(b)). This backlight 46 includes light sources 47 and a light guide plate 48. The irradiated light 49 that was irradiated from the light sources 47 enters to the light guide plate 48 from the edge surface of the light guide plate 48. The irradiated light 49 that has entered to the light guide plate 48 from the light sources 47 is then guided within the light guide plate 48, and the light is emitted from the main surface of the light guide plate 48 as substantially uniform planar light, and then enters to the liquid crystal display device 50.

A color filter, a common electrode, a black matrix and the like, not shown in the figures, are formed in the opposite substrate 35. Meanwhile, the TFT substrate 1 is configured on a so-called active matrix substrate. The TFT substrate 1 includes a display region 36, which contributes to display, and a frame region 37 formed around the display region 36, which does not contribute to display. A plurality of pixels (not shown in the figures) are arranged in a matrix in the display region 36. Although not shown in the figures, each pixel is equipped with a pixel electrode for driving the liquid crystal layer, a TFT for switching and driving the pixel electrode, and a photodiode that is an optical sensor.

Further, for example, the TFT substrate 1 and the opposite substrate 35 are formed in a rectangular shape respectively, and the opposite substrate 35 is slightly smaller than the TFT substrate 1. A display region 36 is formed in a rectangular shape in the region where the TFT substrate 1 and the opposite substrate 35 are overlapping each other. Here, the shapes of the TFT substrate 1, the opposite substrate 35 and the display region 36 are not limited to a rectangular shape and may be in other shapes. A gate driver part 38 is formed in the frame region 37 in the area along one side of the opposite substrate 35. And, a source driver part 39 is formed in the frame region 37 in the area along another side of the opposite substrate 35. A driver circuit, which is a logic circuit, is formed in these gate driver part 38 and source driver part 39 and is connected to TFTs in respective pixels via wires.

Furthermore, as shown in FIG. 2, a TFT 12, which is disposed in the TFT substrate 1 and formed in a pixel or a driver circuit, is a TFT that has a so-called top gate structure including a gate electrode 7 above a semiconductor film 5, and has a structure in which a base coating film 3, a base insulating film 4, semiconductor films 5 and 20, a gate insulating film 6, a gate electrode 7 and an interlayer insulating film 8 are laminated in this order on a substrate 2.

More specifically, as shown in FIG. 2, the TFT 12 includes a base coating film 3 mounted on a surface of the substrate 2, a base insulating film 4 laminated on the base coating film 3 so as to cover the base coating film 3, semiconductor films 5 and 20 formed on a surface of the base insulating film 4, a gate insulating film 6 formed on a surface of the base insulating film 4 so as to cover the semiconductor films 5 and 20, a gate electrode 7 that is an electrode layer formed on a surface of the gate insulating film 6, and an interlayer insulating film 8 laminated on the gate insulating film 6 so as to cover the gate electrode 7.

Moreover, as shown in FIG. 2, the gate electrode 7 is formed so as to face the semiconductor film 5 through the gate insulating film 6. The region of the semiconductor film 5 opposite to the gate electrode 7 is formed as a channel region 22, and one of the regions adjacent to a side of the channel region 22 is formed as a source region 23, and the other region is formed as a drain region 24. Additionally, although not shown in the figure, the TFT 12 may be a TFT with an LDD structure that includes a low-concentration impurity region between the channel region 22 and the source region 23 and between the channel region 22 and the drain region 24, respectively.

Moreover, as shown in FIG. 2, in the gate insulating film 6 and the interlayer insulating film 8, a contact hole 9 exposing a part of the source region 23 of the semiconductor film 5 and a contact hole 10 exposing a part of the drain region 24 of the semiconductor film 5 are formed. Furthermore, a conductive member 11 is filled in these contact holes 9 and 10, respectively.

As shown in FIG. 2, the TFT 12 includes a source electrode 13 and a drain electrode 14. More specifically, the source electrode 13 and the drain electrode 14 are formed on the surface of the interlayer insulating film 8, and the source electrode 13 is electrically connected to the source region 23 of the semiconductor film 5 through the contact hole 9, and the drain electrode 14 is electrically connected to the drain region 24 of the semiconductor film 5 through the contact hole 10.

Furthermore, as shown in FIG. 2, a photodiode 15, which is an optical sensor, is formed in the TFT substrate 1. This photodiode 15 is formed adjacent to the TFT 12 in respective pixel regions, and is made of a semiconductor film 20. More specifically, this photodiode 15 is a PIN photodiode with a horizontal structure made of three layers that has a P-type semiconductor film 25, an N-type semiconductor film 26, and an I- (Intrinsic) layer 27, which is a high resistivity region made of intrinsic semiconductor, formed between the P-type semiconductor film 25 and the N-type semiconductor film 26.

As shown in FIG. 2, in the gate insulating film 6 and the interlayer insulating film 8, a contact hole 16 exposing a part of the P-type semiconductor film 25 of the semiconductor film 20, and a contact hole 17 exposing a part of the N-type semiconductor film 26 of the semiconductor film 20 are formed. Moreover, these contact holes 16 and 17, and the above-mentioned contact holes 9 and 10 are formed simultaneously by etching and these contact holes 16 and 17 are filled with a conductive member 11, respectively.

As shown in FIG. 2, an anode electrode 18 and a cathode electrode 19 are formed on the surface of the interlayer insulating film 8. The anode electrode 18 is electrically connected to the P-type semiconductor film 25 of the semiconductor film 20 through the contact hole 16, and the cathode electrode 19 is electrically connected to the N-type semiconductor film 26 of the semiconductor film 20 through the contact hole 17.

Furthermore, this photodiode 15 is used to detect the existence and the tone of an object (such as a paper, a finger, a pen or the like) placed on the above-mentioned opposite substrate 35. More specifically, as shown in FIG. 1(b), irradiated light 49 emitted from the light sources 47 of the backlight 46 formed on the rear side of the liquid crystal display device 50 is reflected on the above-mentioned object 42, and when this reflected light 43 enters to the photodiode 15, a light leakage current flows in the photodiode 15 in accordance with the intensity of the entered reflected light 43, and the existence and the tone of the object 42 are detected based on this light leakage current.

It is preferable to use an insulating material for a material that constitutes a substrate 2, and this insulating material can be a transparent material such as glass, quartz, plastic (acrylic resin) or the like. Additionally, it is preferable that the thickness of the substrate 2 be 0.3 to 1.1 mm.

For example, silicon oxide ($SiO_2$), silicon nitride (SiNx (x is a positive number)), silicon oxynitride (SiNO) or the like can be used as the material constituting the base coating film 3. Moreover, the base coating film 3 may have a multilayer structure of these materials. It is also preferable that the thickness of the base coating film 3 be 50 to 300 nm.

There is no specific limitation to the material constituting the base insulating film 4, and silicon oxide ($SiO_2$), silicon nitride (SiNx (x is a positive number)), silicon oxynitride (SiNO) or the like can be used, for example. Additionally, it is preferable that the thickness of the base insulating film 4 be 50 to 300 nm or less.

Semiconductor films 5 and 20 are made of a polysilicon film, and the polysilicon film that constitutes the semiconductor films 5 and 20 is obtained by irradiating a silicon film such as an amorphous silicon film with laser light to poly-crystallize it. The semiconductor films 5 and 20 are obtained by performing a lateral crystal growth in the inner direction of the film surface, and are patterned into a long and thin reed shape. The semiconductor film 5 constitutes the active layer of the TFT 12, and this active layer is made of a source region 23 that is doped with high-concentration impurities such as phosphorus and boron on one side, a drain region 24 that is doped with high-concentration impurities likewise on the other side, and a channel region 22 formed in between. Moreover, the semiconductor film 20 constitutes the photodiode 15, and it is made of a P-type semiconductor film 25 that is doped with high-concentration impurities such as boron formed on one side, an N-type semiconductor film 26 that is doped with high-concentration impurities such as phosphorus likewise formed on the other side, and an Mayer 27 that is a high resistivity region made of intrinsic semiconductor formed in between. It is preferable that the thickness of the semiconductor films 5 and 20 be 20 to 100 nm.

There is no specific limitation to the material that constitutes the gate insulating film 6. Silicon oxide ($SiO_2$), or a material with a lower dielectric constant than silicon oxide, such as SiOF, SiOC or the like, or a material with a higher dielectric constant than silicon oxide, such as silicon nitride (SiNx (x is a positive number)) such as trisilicon tetranitride ($Si_3N_4$), silicon oxynitride (SiNO), titanium dioxide ($TiO_2$), dialuminum trioxide ($Al_2O_3$), tantalum oxide such as ditantalum pentoxide ($Ta_2O_5$), hafnium dioxide ($HfO_2$) and xirconium dioxide ($ZrO_2$), can be used. Additionally, either the same material or different materials may be used for the material constituting the base insulating film 4 and the gate insulating film 6. Also, the base insulating film 4 and the gate insulating film 6 may have either a single-layered structure or a multi-layered structure. It is preferable that the thickness of the gate insulating film 6 be 30 to 150 nm.

It is preferable to use a material with a high melting point for the material constituting the gate electrode 7. For example, a metal with a high melting point, such as molybdenum (Mo), tantalum (Ta), tungsten (W) and titanium (Ti) or the like, or silicide with a high melting point, such as molybdenum silicide or the like, are preferably used. Moreover, it is preferable that the thickness of the gate electrode 7 be 100 to 500 nm. Additionally, the same material as the material constituting the above-mentioned gate electrode 7 may be used for the material constituting the conductive member 11.

There is no specific limitation to the material that constitutes the interlayer insulating film 8, and silicon oxide ($SiO_2$), silicon nitride (SiNx (x is a positive number)) or the like can be used, for example. Moreover, it is preferable that the thickness of the interlayer insulating film 19 be 500 to 2000 nm or less.

Here, as shown in FIG. 2, in the present embodiment, a light-shielding film 28 that is embedded in a base coating film 3 is positioned below the semiconductor film 20. More specifically, a concave part 21 for embedding the light-shielding part 28 is formed in the base coating film 3, and the light-shielding part 28 is embedded in the concave part 21 so that a surface 28a of the light-shielding part 28 on the semiconductor film 20 side and a surface 3a of the base coating film 3 on the semiconductor film 20 side are substantially flush with each other.

According to this structure, as shown in FIGS. 3(a) and 3(b), when a polysilicon film 29 that constitutes a semiconductor film 20 is formed by scan irradiating a silicon film such as an amorphous silicon film with laser light L for poly-crystallization, no step is formed on the polysilicon film 29 in the regions A corresponding to the edges of the light-shielding film 28 even when the light-shielding film 28 is formed below the polysilicon film 29. Therefore, even when the polysilicon film 29 is formed by completely melting the amorphous silicon film by laser light L to perform a lateral crystal growth expanding in the scanning direction of the laser light L, it is possible to prevent the occurrence of step disconnection and film peel-off on the polysilicon film 29 with certainty. As a result, as described later, when a polysilicon film 29 is patterned by a photolithography method, it is possible to prevent a pattern chipping and the like caused by step disconnection and film peel-off. Further, uneven coating caused by step disconnection and film peel-off can also be prevented when a resist is applied on the patterned polysilicon film 29 by a spin coating method or the like.

As shown in FIG. 1(b), the light-shielding film 28 is provided to prevent light (irradiated light from the light sources 47 of the backlight 46) from entering to the photodiode 15, and to make sure that only reflected light 43 reflected on the above-mentioned object 42 enters to the photodiode 15. There is no specific limitation to the material constituting the light-shielding film 28, and a metal with a high melting point, such as molybdenum (Mo), tantalum (Ta), tungsten (W), and titanium (Ti) and the like, or an alloyed material or a chemical compound material mainly made of such metals with a high melting point is preferably used, for example. Additionally, it is preferable that the thickness of the light-shielding film 28 be 50 to 300 nm.

Next, an example of a method for manufacturing a liquid crystal display device 50 will be described. FIG. 4 through FIG. 14 are cross-sectional views showing a method for manufacturing a liquid crystal display device of Embodiment 1 of the present invention.

Base Coating Film Formation Step

Figure 4:
FIG. 4 is a cross-sectional view showing a method for manufacturing a liquid crystal display device of Embodiment 1 of the present invention.

First, as shown in FIG. 4, a base coating film 3 made of silicon oxide or the like is formed on a substrate 2, which is a glass substrate, plastic substrate, or like substrate, by a CVD method, for example.

Figure 5:
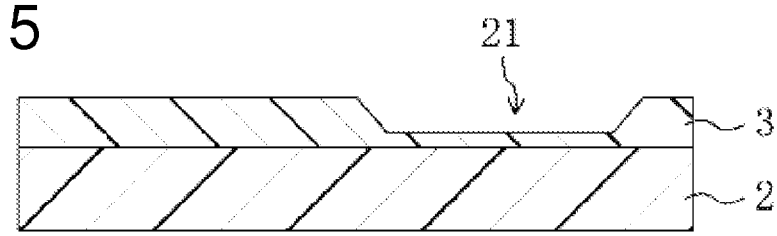
FIG. 5 is a cross-sectional view showing a method for manufacturing a liquid crystal display device of Embodiment 1 of the present invention.

Next, as shown in FIG. 5, after the base coating film 3 is patterned by photolithography, a concave part 21 for embedding a light-shielding film 28 is formed by etching the base coating film 3 by a dry etching method. Further, here, in order to embed the light-shielding film 28 in the concave part 21 with certainty by improving the coverage of the light-shielding film 28 in the concave part 21, the concave part 21 is formed in a tapered cross-sectional shape.

Light-Shielding Film Formation Step

Figure 6:
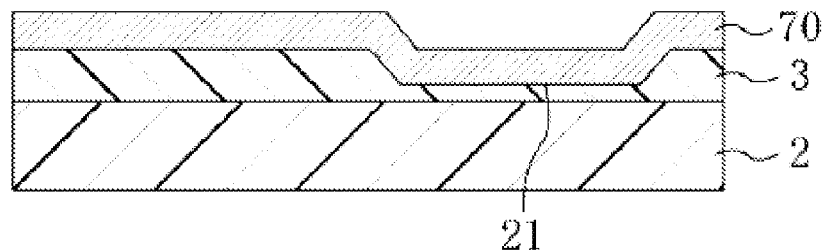
FIG. 6 is a cross-sectional view showing a method for manufacturing a liquid crystal display device of Embodiment 1 of the present invention.
Figure 7:
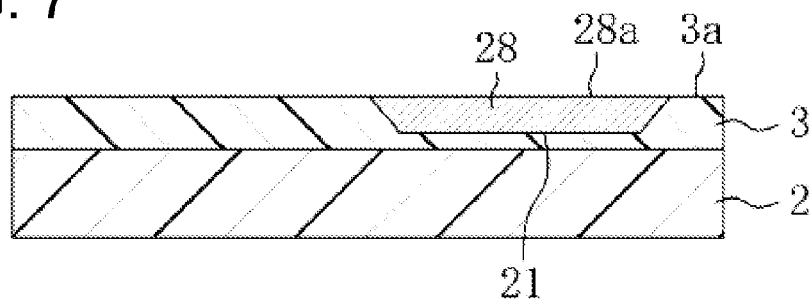
FIG. 7 is a cross-sectional view showing a method for manufacturing a liquid crystal display device of Embodiment 1 of the present invention.

Next, as shown in FIG. 6, a conductive film 70 is formed by forming a metal material such as tungsten (W) or the like into a film on the base coating film 3 by a sputtering method or an anode oxidation method, and after that, the conductive film 70 is patterned by a photo etching method. By this, as shown in FIG. 7, a light-shielding film 28 is formed such that it is embedded in the concave part 21 formed in the base coating film 3. Here, as described above, the light-shielding film 28 is embedded and formed in the concave part 21 so that the surface 28a of the light-shielding film 28 on the semiconductor film 20 side and the surface 3a of the base coating film 3 on the semiconductor film 20 side are substantially flush with each other. Accordingly, in the present embodiment, it is possible to embed the light-shielding film 28 in the base coating film 3 with a simple method. Furthermore, a method of forming the light-shielding film 28 by embedding it in the concave part 21 by using a tungsten plug may be used as well.

Base Insulating Film Formation Step

Figure 8:
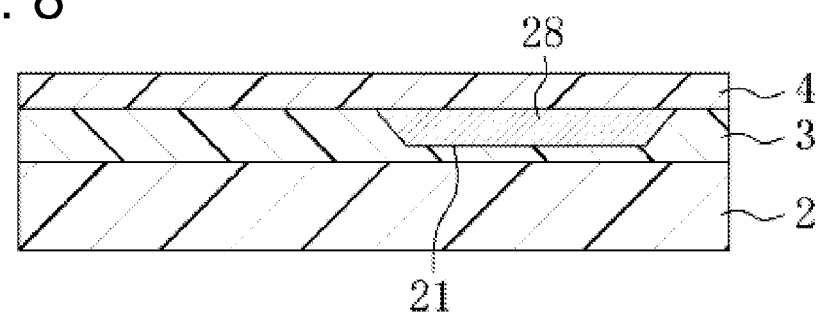
FIG. 8 is a cross-sectional view showing a method for manufacturing a liquid crystal display device of Embodiment 1 of the present invention.

Next, as shown in FIG. 8, a base insulating film 4 made of silicon oxide is formed on the base coating film 3 by a CVD method, for example so as to cover the light-shielding film 28, and by this, the light-shielding film 28 is covered.

Silicon Film Formation Step

Figure 9:
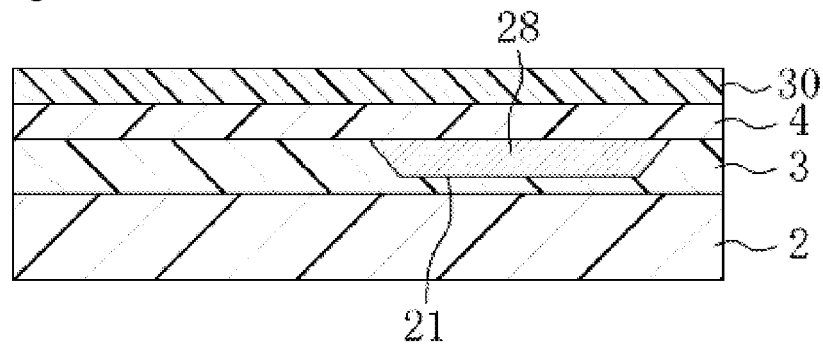
FIG. 9 is a cross-sectional view showing a method for manufacturing a liquid crystal display device of Embodiment 1 of the present invention.

Next, as shown in FIG. 9, on the base insulating film 4, a non-crystalline silicon film (for example, an amorphous silicon film) 30 is formed above the light-shielding film 28 by a sputtering method, a plasma CVD method or a LPCVD (Low Pressure CVD) method. The thickness of the non-crystalline silicon film 30 is 20 to 100 nm, for example.

Polysilicon Film Formation Step

Next, as shown in the above-mentioned FIGS. 3(a) and 3(b), a polysilicon film 29 is formed by scan irradiating the non-crystalline silicon film 30 with linear-shaped laser light L to poly-crystallize the non-crystalline silicon film 30. A lateral crystal growth occurs on the non-crystalline silicon film 30 along the scanning direction of the laser light L, and then a polysilicon film 29 can be obtained. Moreover, a microcrystalline silicon film may be formed instead of the polysilicon film 29 by micro-crystallizing the non-crystalline silicon film 30 by irradiating it with laser with lower power.

Here, as described above, even when the light-shielding film 28 is formed below the polysilicon film 29, no step is formed on the polysilicon film 29 in the regions A corresponding to the edges of the light-shielding film 28. Therefore, it is possible to prevent the occurrence of step disconnection and film peel-off on the polysilicon film 29 with certainty.

Further, UV laser, visible laser, infrared laser, excimer laser or the like can be used for the laser to be used, for example. The laser light L may be any one of CW laser light, quasi-CW laser light, and pulse laser light, but it is preferable to use CW light or quasi-CW light in terms of simply and surely causing a lateral crystal growth on the non-crystalline silicon film 30 in the scanning direction of the laser light L. Quasi-CW light is a pulse laser with the wavelength of 10 MHz or more such as a mode-locked laser or the like, and it irradiates the next pulse light before the melted non-crystalline silicon film 30 is solidified, and therefore, quasi-CW light can be seen as same as CW light in terms of the effect. The length of the linear-shaped laser light L is 0.05 to 100 mm, the width is 5 to 50 μm, and the power is 5 to 100 W, for example. Additionally, the scanning speed is 10 to 2000 mm/second, for example.

Figure 10:
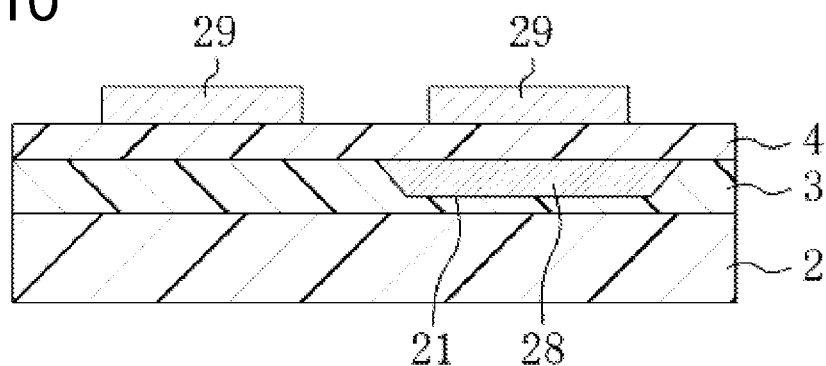
FIG. 10 is a cross-sectional view showing a method for manufacturing a liquid crystal display device of Embodiment 1 of the present invention.

Next, as shown in FIG. 10, the polysilicon film 29 is patterned by a photolithography method. Here, as described above, because step disconnection and film peel-off can be prevented on the polysilicon film 29 with certainty, it is possible to prevent a pattern chipping and the like caused by step disconnection and film peel-off.

Gate Insulating Film Formation Step

Figure 11:
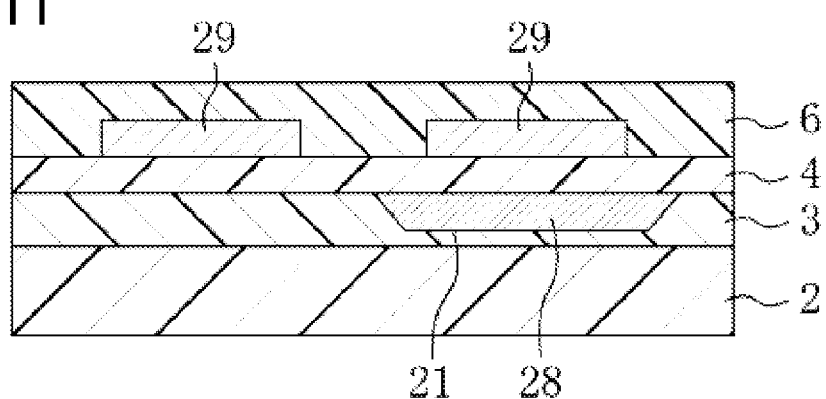
FIG. 11 is a cross-sectional view showing a method for manufacturing a liquid crystal display device of Embodiment 1 of the present invention.

Next, as shown in FIG. 11, a gate insulating film 6 made of silicon oxide is formed on the base insulating film 4 by a CVD method, for example, so as to cover the polysilicon film 29.

Channel Region Formation Step

Next, from the perspective of controlling the threshold voltage of the TFT 12, a channel region 22 is formed by doping the polysilicon film 29, which forms the semiconductor film 5 constituting the active layer of the TFT 12, with impurity ions through the gate insulating film 6 by an ion implantation method or an ion doping method.

Gate Electrode Formation Step

Figure 12:
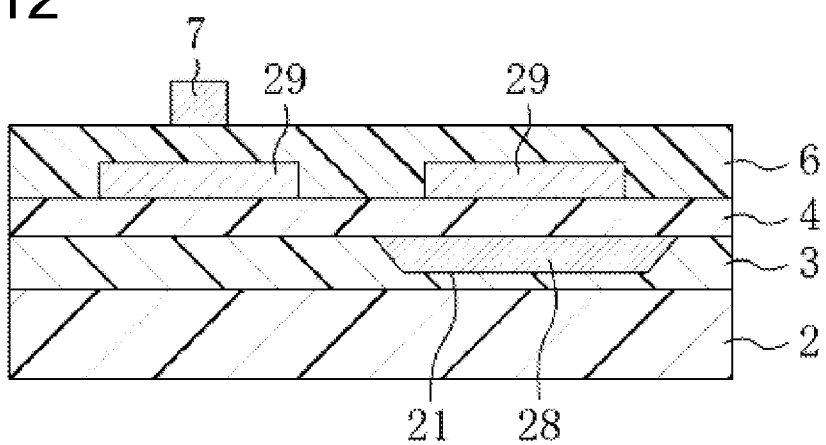
FIG. 12 is a cross-sectional view showing a method for manufacturing a liquid crystal display device of Embodiment 1 of the present invention.

Next, as shown in FIG. 12, a gate electrode 7 is patterned and formed on the gate insulating film 6 by using a metal material such as molybdenum (Mo). As for a method for forming the gate electrode 7, a method of forming a metal material or silicide into a film by a sputtering method and then patterning it by a photo etching method or like method can be used.

Semiconductor Layer Formation Step

Figure 13:
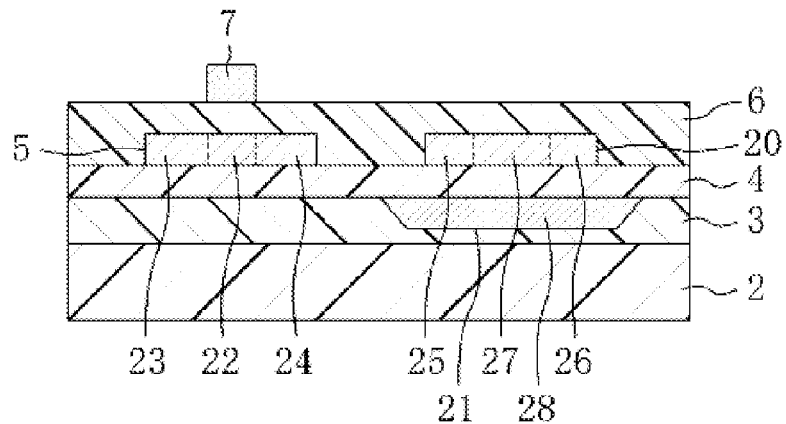
FIG. 13 is a cross-sectional view showing a method for manufacturing a liquid crystal display device of Embodiment 1 of the present invention.

Next, a resist is applied on the patterned polysilicon film 29 (in other words, on a surface of the gate insulating film 6) by a spin coating method or the like, and the polysilicon film 29 is doped with impurities such as phosphorus, boron or the like using the gate electrode 7 and the resist as a mask by an ion implantation method or an ion doping method. After that, the impurities are activated by a heating treatment such as a thermal anneal treatment or an excimer laser treatment. As a result, as shown in FIG. 13, a semiconductor layer 5 that constitutes the active layer of the TFT 12 is formed with a structure having a channel region 22, a source region 23 and a drain region 24, and a semiconductor layer 20 that constitutes a photodiode 15 is formed with a structure having a P-type semiconductor film 25, an N-type semiconductor film 26 and an I-layer 27. Here, as described above, because step disconnection and film peel-off can be prevented on the polysilicon film 29 with certainty, it is possible to prevent uneven coating of a resist caused by step disconnection and film peel-off. Moreover, although not shown in the figures, other than the above-mentioned method of forming a TFT with a single-drain structure, a TFT with an LDD structure in which a low-concentration impurity region is formed between the channel region 22 and the source region 23 and between the channel region 22 and the drain region 24, respectively, by a generally available method may be used. Specifically, before the source region 23 and the drain region 24 are formed, a low-concentration impurity region is formed near both ends of the gate by doping low-concentration ions using the gate electrode 7 and the resist as a mask. After that, using a new resist as a mask, the source region 23 and the drain region are formed by doping the outside of the low-concentration region with high-concentration ions. By these steps, a TFT with an LDD structure having a low-concentration impurity region between the channel region 22 and the source region 23 and between the channel region 22 and the drain region 24, respectively, can be formed.

Interlayer Insulating Film Formation Step

Figure 14:
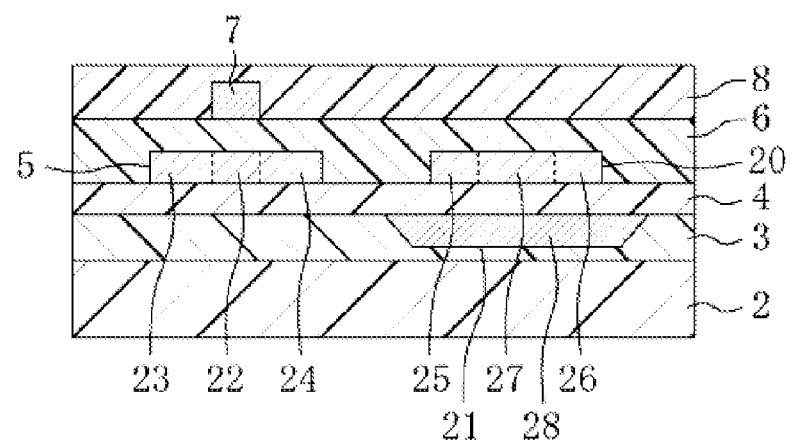
FIG. 14 is a cross-sectional view showing a method for manufacturing a liquid crystal display device of Embodiment 1 of the present invention.

Next, as shown in FIG. 14, an interlayer insulating film 8 made of silicon oxide is formed on the gate insulating film 6 by a CVD method, for example, so as to cover the gate electrode 7, and the gate electrode 7 is covered.

Contact Hole and Electrode Formation Step

Next, by etching the gate insulating film 6 and the interlayer insulating film 8, contact holes 9, 10, 16, and 17 are simultaneously formed. More specifically, in the gate insulating film 6 and the interlayer insulating film 8 in regions above the semiconductor film 5, the contact hole 9 is formed so as to expose a part of the source region 23 of the semiconductor film 5, and the contact hole 10 is formed so as to expose a part of the drain region 24 of the semiconductor film 5. Moreover, in the gate insulating film 6 and the interlayer insulating film 8 in regions above the semiconductor film 20, the contact hole 16 is formed so as to expose a part of the P-type semiconductor film 25 of the semiconductor film 20, and the contact hole 17 is formed so as to expose a part of the N-type semiconductor film 26 of the semiconductor film 20. And then, a source electrode 13, a drain electrode 14, an anode electrode 18 and a cathode electrode 19, which are connected to the semiconductor films 5 and 20, respectively, through the contact holes 9, 10, 16 and 17, are formed by forming a conductive member 11 by filling a conductive material inside the contact holes 9, 10, 16 and 17, respectively, and patterning the conductive material by a photolithography method or the like after the conductive material is formed by being laminated on a surface of the interlayer insulating film 8. Accordingly, a TFT substrate 1 shown in FIG. 2 is manufactured. A low resistant metal such as aluminum (Al), copper (Cu) and silver (Ag) or the like, or an alloyed material or a chemical compound material mainly made of these low resistant metals can be used as the above-mentioned conductive material.

Coupled Member Formation Step

By coupling the manufactured TFT substrate 1 and an opposite substrate 35 together with a seal member (not shown in the figure) and a liquid crystal layer (not shown in the figure) in between, a liquid crystal display device 50 shown in FIGS. 1(a) and 1(b) is manufactured.

Furthermore, although not shown in the figure, as for a method for manufacturing an opposite substrate 35, first, a color filter, a light-shielding film and the like are formed in a specific pattern on a transparent substrate such as a glass substrate or a plastic substrate by a photolithography method or the like, and then a transparent common electrode is uniformly formed of ITO or the like. After that, an alignment film (not shown in the figures) is formed so as to cover the above-mentioned common electrode and the like. Accordingly, the opposite substrate is manufactured.

The following effects can be obtained by the present embodiment described above.

(1) The present embodiment has a structure in which a light-shielding film 28 is formed below a semiconductor film 20, and the light-shielding film 28 is embedded in a base coating film 3. Therefore, when a polysilicon film 29 that constitutes the semiconductor film 20 is formed by irradiating a non-crystalline silicon film 30 with laser light L for polycrystallization, no step is formed on the polysilicon film 29 in the regions A corresponding to the edges of the light-shielding film 28 even when the light-shielding film 28 is formed below the polysilicon film 29. As a result, even when the polysilicon film 29 is formed by completely melting the non-crystalline silicon film 30 by laser light L to perform a lateral crystal growth expanding in the scanning direction of the laser light L, it is possible to prevent the occurrence of step disconnection and film peel-off on the polysilicon film 29 with certainty. As a result, it becomes possible to provide a liquid crystal display device 50 that can prevent lowering of the yield.

(2) The present embodiment has a structure in which the concave part 21 for embedding the light-shielding film 28 is formed in a base coating film 3. Moreover, the light-shielding film 28 is embedded in the concave part 21 so that the surface

28a of the light-shielding film 28 on the semiconductor film 20 side and the surface 3a of the base coating film 3 on the semiconductor film 20 side are substantially flush with each other. Accordingly, it becomes possible to embed the light-shielding film 28 in the base coating film 3 with a simple structure, and to surely prevent a step from forming on the polysilicon film 29 in the regions A corresponding to the edges of the light-shielding film 28.

(3) In the present embodiment, a semiconductor film 20 constitutes a photodiode 15 that is an optical sensor, which receives reflected light from an object and detects the existence of the object based on the intensity of the reflected light. Therefore, it is possible to prevent lowering of the yield for especially a liquid crystal display device 50 that includes the photodiode 15 and the light-shielding film 28 for preventing other light (for example, irradiated light from a backlight) from entering to the photodiode 15.

(4) The present embodiment has a structure in which the concave part 21 for embedding the light-shielding film 28 is formed in a tapered cross-sectional shape. Accordingly, because the coverage of the light-shielding film 28 in the concave part 21 is improved, it is possible to surely embed the light-shielding film 28 in the concave part 21.

(5) The present embodiment has a structure in which semiconductor films 5 and 20 are a laterally-grown polysilicon film 29. Therefore, it is possible to surely improve the characteristics of the TFT 12, and to prevent step disconnection specific to laterally-grown crystal.

Embodiment 2

Figure 15:
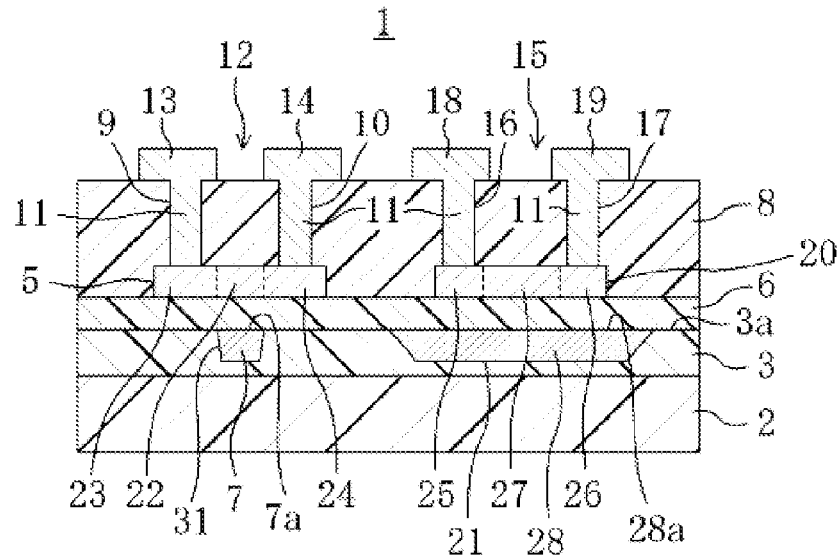
FIG. 15 is a cross-sectional view showing a schematic structure of a TFT substrate in a semiconductor device of Embodiment 2 of the present invention.

Next, Embodiment 2 of the present invention will be described. FIG. 15 is a cross-sectional view showing a schematic structure of a TFT substrate in a semiconductor device of Embodiment 2 of the present invention. Here, the same reference numerals are used for the components similar to those of the above-mentioned Embodiment 1, and the description of them will be omitted. Moreover, the semiconductor device is similar to the one described in the above-mentioned Embodiment 1, and therefore, the detailed description of it will be omitted as well. In the present embodiment, a TFT that is an active element and a photodiode that is an optical sensor will also be explained as examples of a semiconductor element, and a liquid crystal display device that includes a TFT and a photodiode will be explained as a semiconductor device.

In the present embodiment, as shown in FIG. 15, a TFT 12 formed in a TFT substrate 1 of a liquid crystal display device 50 is a TFT with a so-called bottom gate structure that has a gate electrode 7 below a semiconductor film 5, and includes a base coating film 3, a gate electrode 7, a gate insulating film 6, semiconductor films 5 and 20 and an interlayer insulating film 8 laminated in this order on a substrate 2. Moreover, although not shown in the figure, the TFT 12 may be a TFT with an LDD structure in which a low-concentration impurity region is formed between the channel region 22 and the source region 23 and between the channel region 22 and the drain region 24, respectively.

More specifically, as shown in FIG. 15, the TFT 12 includes a base coating film 3 formed on a surface of a substrate 2, a gate electrode 7 formed on the base coating film 3, a gate insulating film 6 laminated on the base coating film 3 so as to cover the gate electrode 7, semiconductor films 5 and 20 formed on a surface of the gate insulating film 6, and an interlayer insulating film 8 formed on a surface of the gate insulating film 6 so as to cover the semiconductor films 5 and 20.

Furthermore, as shown in FIG. 15, in the present embodiment, the gate electrode 7 is positioned below the semiconductor film 5, and is embedded in the base coating film 3. More specifically, a concave part 31 for embedding the gate electrode 7 is formed in the base coating film 3 in addition to a concave part 21 for embedding a light-shielding film 28, and the gate electrode 7 is embedded in the concave part 31 so that the surface 7a of the gate electrode 7 on the semiconductor film 5 side and the surface 3a of the base coating film 3 on the semiconductor film 5 side are substantially flush with each other.

This structure enables forming of the gate electrode 7 and the light-shielding film 28 in the same manufacturing step. Because of this, the number of the manufacturing steps can be reduced compared to when manufacturing a liquid crystal display device equipped with a TFT 12 that has a top gate structure described in the above-mentioned Embodiment 1.

Next, an example of a method for manufacturing a liquid crystal display device 50 will be described. FIG. 16 through FIG. 24 are cross-sectional views showing a method for manufacturing a liquid crystal display device of Embodiment 2 of the present invention.

Base Coating Film Formation Step

Figure 16:
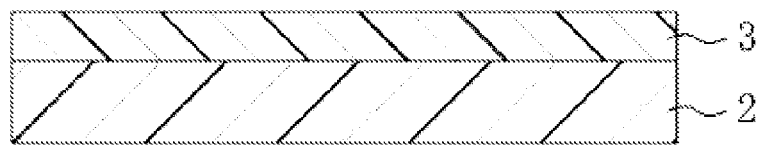
FIG. 16 is a cross-sectional view showing a method for manufacturing a liquid crystal display device of Embodiment 2 of the present invention.

First, as shown in FIG. 16, a base coating film 3 made of silicon oxide or the like is formed on a substrate 2, which is a glass substrate, a plastic substrate, or like substrate, by a CVD method, for example.

Figure 17:
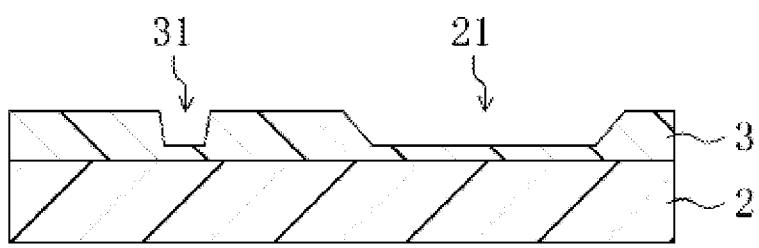
FIG. 17 is a cross-sectional view showing a method for manufacturing a liquid crystal display device of Embodiment 2 of the present invention.

Next, as shown in FIG. 17, the base coating film 3 is patterned by a photolithography method. After that, a concave part 21 for embedding a light-shielding film 28 and a concave part 31 for embedding a gate electrode 7 are simultaneously formed by etching the base coating film 3 by a dry etching method. Here, the concave part 31 may be formed in a tapered cross-sectional shape, as shown in FIG. 17, from the perspective of surely embedding the gate electrode 7 in the concave part 31 by improving the coverage of the gate electrode 7 in the concave part 31.

Light-Shielding Film and Gate Electrode Formation Step

Figure 18:
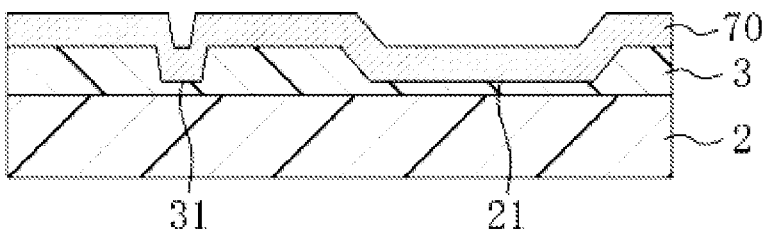
FIG. 18 is a cross-sectional view showing a method for manufacturing a liquid crystal display device of Embodiment 2 of the present invention.
Figure 19:
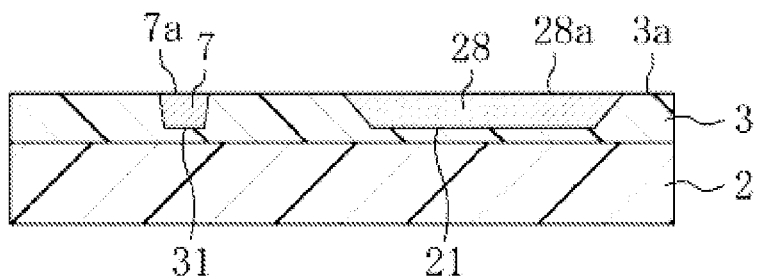
FIG. 19 is a cross-sectional view showing a method for manufacturing a liquid crystal display device of Embodiment 2 of the present invention.

Next, as shown in FIG. 18, a conductive film 70 is formed on the base coating film 3 by forming a metal material such as tungsten (W) into a film by a sputtering method or an anode oxidation method, and then the conductive film 70 is patterned by a photo etching method. As a result, as shown in FIG. 19, a light-shielding film 28 is formed such that it is embedded in the concave part 21 formed in the base coating film 3, and a gate electrode 7 is formed such that it is embedded in the concave part 31. When performing this step, as described above, the light-shielding film 28 is embedded and formed in the concave part 21 so that the surface 28a of the light-shielding film 28 on the semiconductor film 20 side and the surface 3a of the base coating film 3 on the semiconductor film 20 side are substantially flush with each other. A gate electrode 7 is also embedded and formed in the concave part 31 so that the surface 7a of the gate electrode 7 on the semiconductor film 5 side and the surface 3a of the base coating film 3 on the semiconductor film 5 side are substantially flush with each other. As just described, in the present embodiment, the light-shielding film 28 and the gate electrode 7 are formed simultaneously, and therefore, the gate electrode 7 and the light-shielding film 28 can be formed in the same manufacturing step. Because of this, it becomes possible to reduce the number of the manufacturing steps.

Gate Insulating Film Formation Step

Figure 20:
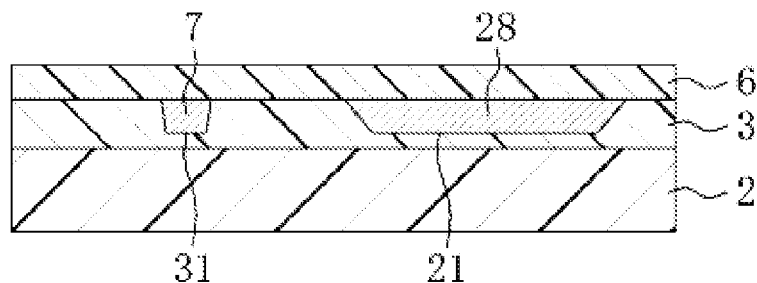
FIG. 20 is a cross-sectional view showing a method for manufacturing a liquid crystal display device of Embodiment 2 of the present invention.

Next, as shown in FIG. 20, a gate insulating film 6 made of silicon oxide is formed on the base coating film 3 so as to cover the light-shielding film 28 and the gate electrode 7 by a CVD method, for example, and by this, the light-shielding film 28 and the gate electrode 7 are covered.

Silicon Film Formation Step

Figure 21:
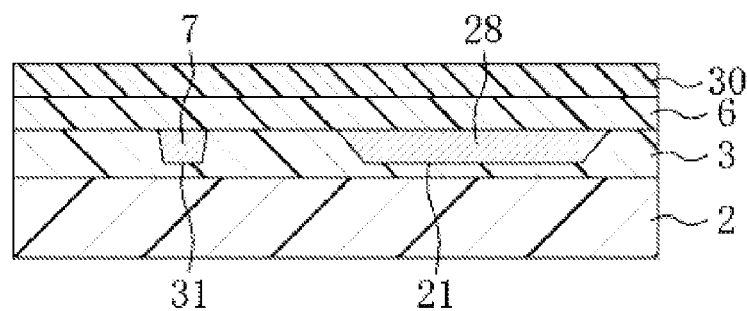
FIG. 21 is a cross-sectional view showing a method for manufacturing a liquid crystal display device of Embodiment 2 of the present invention.

Next, as shown in FIG. 21, a non-crystalline silicon film (for example, an amorphous silicon film) 30 is formed on the gate insulating film 6 by a sputtering method, a plasma CVD method, or a LPCVD (Low Pressure CVD) method. The thickness of the non-crystalline silicon film 30 is 20 to 100 nm, for example.

Polysilicon Film Formation Step

Next, like Embodiment 1 described above, as shown in the above-mentioned FIGS. 3(*a*) and 3(*b*), a polysilicon film 29 is formed by irradiating the non-crystalline silicon film 30 with linear-shaped laser light L to poly-crystallize the non-crystalline silicon film 30. Furthermore, a structure in which a microcrystalline silicon film is formed instead of the polysilicon film 29 by micro-crystallizing the non-crystalline silicon film 30 by irradiating laser with lower power may also be used.

Here, like Embodiment 1 described above, no step is formed on the polysilicon film 29 in the regions A corresponding to the edges of the light-shielding film 28 even when the light-shielding film 28 is formed below the polysilicon film 29. Therefore, it is possible to prevent the occurrence of step disconnection and film peel-off on the polysilicon film 29 with certainty.

Figure 22:
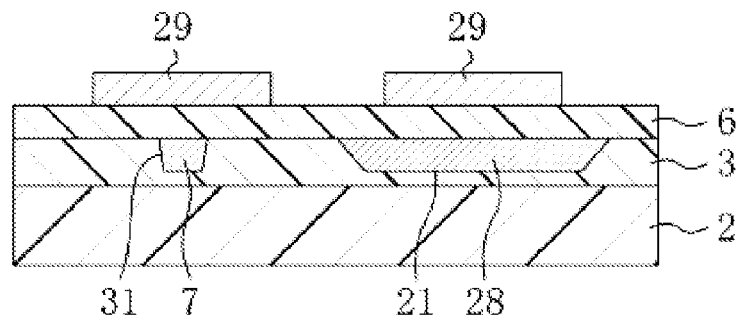
FIG. 22 is a cross-sectional view showing a method for manufacturing a liquid crystal display device of Embodiment 2 of the present invention.

Next, as shown in FIG. 22, the polysilicon film 29 is patterned by a photolithography method.

Semiconductor Layer Formation Step

Figure 23:
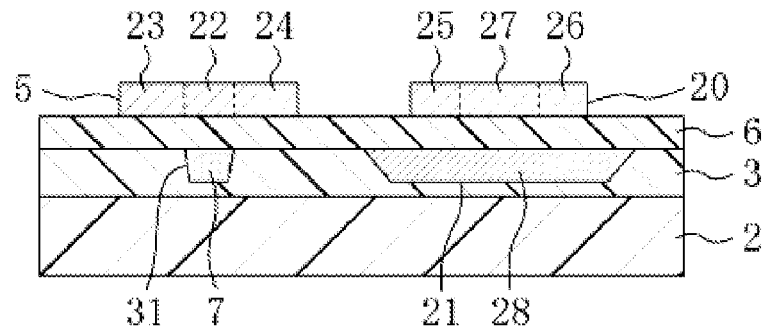
FIG. 23 is a cross-sectional view showing a method for manufacturing a liquid crystal display device of Embodiment 2 of the present invention.

Next, like Embodiment 1 described above, a channel region 22 with a controlled threshold is formed by doping the polysilicon film 29, which forms a semiconductor film 5 constituting the active layer of a TFT 12, with impurity ions. Next, in order to form a source region and a drain region, the polysilicon film 29 is doped with impurities using a resist formed by a photolithography method as a mask, and then, those impurities are activated by a heating treatment. As a result, as shown in FIG. 23, a semiconductor layer 5 that constitutes the active layer of the TFT 12 is formed so as to include a channel region 22, a source region 23 and a drain region 24, and a semiconductor layer 20 that constitutes a photodiode 15 is formed so as to include a P-type semiconductor film 25, an N-type semiconductor film 26 and an Mayer. Moreover, although not shown in the figures, other than the method of forming a TFT with a single-drain structure described above, a TFT with an LDD structure in which a low-concentration impurity region is formed between the channel region 22 and the source region 23, and between the channel region 22 and the drain region 24, respectively, by a generally available method may be formed. Specifically, before the source region 23 and the drain region 24 are formed, low-concentration impurity regions are formed near both ends of the gate by performing low-concentration ion doping using a resist as a mask. After that, the source region 23 and the drain region are formed by doping the outside of the low-concentration region with high-concentration ions using a new resist as a mask. As a result, a TFT with an LDD structure in which a low-concentration impurity regions are formed between the channel region 22 and the source region 23 and between the channel region 22 and the drain region 24, respectively, can be created.

Interlayer Insulating Film Formation Step

Figure 24:
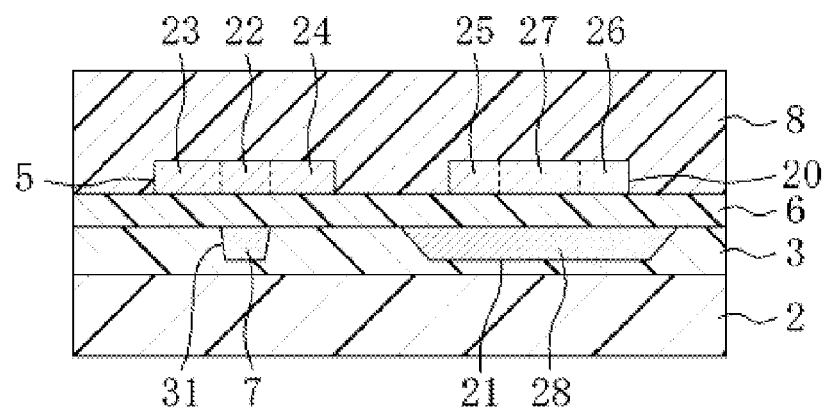
FIG. 24 is a cross-sectional view showing a method for manufacturing a liquid crystal display device of Embodiment 2 of the present invention.

Next, as shown in FIG. 24, an interlayer insulating film 8 made of silicon oxide is formed on the gate insulating film 6 by a CVD method, for example, so as to cover the semiconductor layers 5 and 20, and by this, the semiconductor layers 5 and 20 are covered.

Contact Hole and Electrode Formation Step

Next, contact holes 9, 10, 16 and 17 are formed simultaneously by etching the interlayer insulating film 8. Then, conductive members 11 are formed by filling a conductive material inside the contact holes 9, 10, 16 and 17, respectively, and the conductive material that was formed by laminating it on a surface of the interlayer insulating film 8 is patterned. By this, a source electrode 13, a drain electrode 14, an anode electrode 18, and a cathode electrode 19 that are connected to the semiconductor films 5 and 20, respectively, through the contact holes 9, 10, 16 and 17 are formed. Accordingly, a TFT substrate 1 shown in FIG. 15 is manufactured.

Coupled Member Formation Step

Then, the manufactured TFT substrate 1 and the opposite substrate 35 are bonded together with a sealing member (not shown in the figure) and a liquid crystal layer (not shown in the figure) in between. By this, a liquid crystal display device 50 shown in FIGS. 1(*a*) and 1(*b*) is manufactured.

According to the present embodiment described above, the following effects can be obtained in addition to the effects described above in (1) through (5).

(6) The present embodiment has a structure in which the gate electrode 7 for the TFT 12 is embedded in the base coating film 3. Therefore, it becomes possible to form a light-shielding film 28 and the gate electrode 7 embedded in the base coating film 3 in the same manufacturing step, and therefore, the number of the manufacturing steps can be reduced.

(7) The present embodiment has a structure in which the concave part 31 for embedding the gate electrode 7 is formed in a tapered cross-sectional shape. Therefore, because the coverage of the gate electrode 7 in the concave part 31 is improved, it becomes possible to embed the gate electrode 7 in the concave part 31 with certainty.

Embodiment 3

Figure 25:
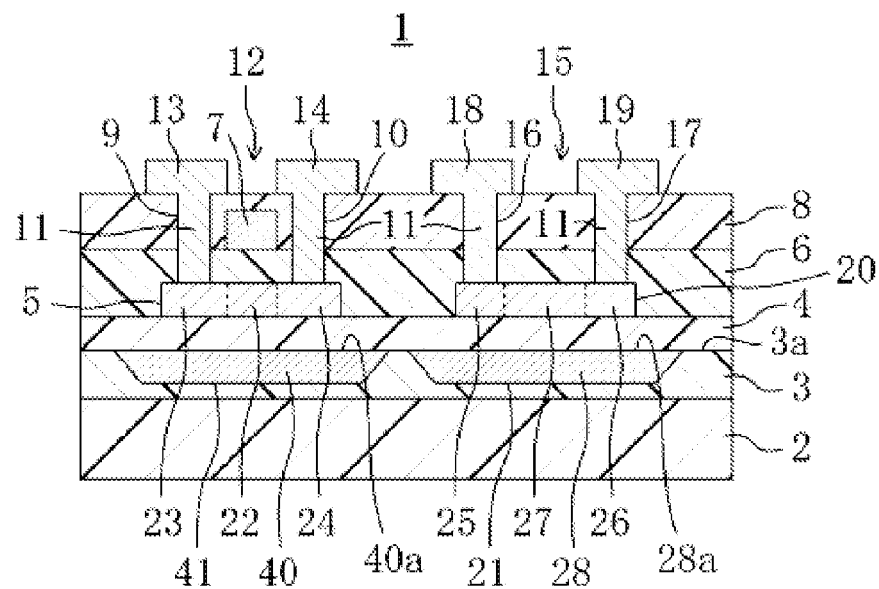
FIG. 25 is a cross-sectional view showing a schematic structure of a TFT substrate in a semiconductor device of Embodiment 3 of the present invention.
Figure 26:
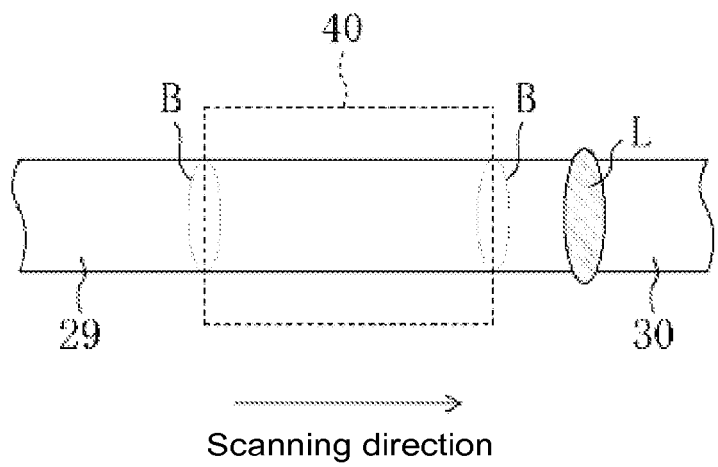
FIGS. 26(a) and 26(b) are views showing a polysilicon film formation step in a semiconductor device of Embodiment 3 of the present invention.
Figure 26:
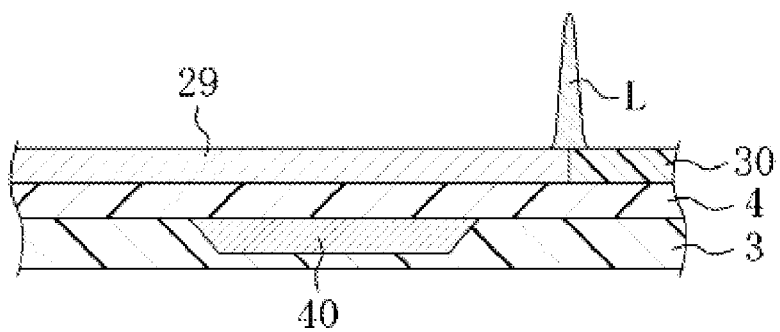

Next, Embodiment 3 of the present invention will be described. FIG. 25 is a cross-sectional view showing a schematic structure of a TFT substrate in a semiconductor device of Embodiment 3 of the present invention, and FIGS. 26(*a*) and 26(*b*) are views showing a polysilicon film formation step in a semiconductor device of Embodiment 3 of the present invention. The same reference numerals are used for the components similar to those of the above-mentioned Embodiment 1, and the description of them will be omitted. Moreover, the semiconductor device is similar to the one described in the above-mentioned Embodiment 1, and therefore, the detailed description of it will be omitted here. A TFT that is an active element, and a photodiode that is an optical sensor will be explained as examples of semiconductor elements, and a liquid crystal display device including a TFT and a photodiode will be explained as a semiconductor device in the present embodiment as well.

In the present embodiment, as shown in FIG. 25, in addition to the light-shielding film 28 described above, a light-shielding film 40, which is positioned below the semiconductor film 5 and embedded in the base coating film 3, is formed in a TFT substrate 1 of a liquid crystal display device 50. More specifically, a concave part 41 for embedding the light-shielding film 40 is formed in the base coating film 3, and the light-shielding film 40 is embedded in the concave part 41 so that the surface 40*a* of the light-shielding film 40 on the semiconductor film 5 side and the surface 3*a* of the base coating film 3 on the semiconductor film 5 side are substantially flush with each other. Furthermore, although not shown in the figure, the TFT 12 may be a TFT with an LDD structure in which a low-concentration impurity region is formed between the channel region 22 and the source region 23 and between the channel region 22 and the drain region 24, respectively.

The light-shielding film 40 is formed to prevent the increase in off-currents caused by the light entering to a channel region of the semiconductor film 5 by preventing light (irradiated light from a backlight) from entering to the semiconductor film 5 that constitutes the active layer of the TFT 12. A material that is the same as or similar to the one used for the above-mentioned light-shielding film 28 is preferably used as the material that constitutes the light-shielding film 40. Further, it is preferable that the thickness of the light-shielding film 40 be 50 to 300 nm. Moreover, it is preferable that the width of a part of the light-shielding film 40 that extends beyond the semiconductor film 5, when viewed in a plan view, be approximately the same as the thickness of the semiconductor film 5.

Because of such a structure, as shown in FIGS. 26(a) and 26(b), when forming a polysilicon film 29 that constitutes a semiconductor film 5 by irradiating a non-crystalline silicon film such as an amorphous silicon film with laser light L to poly-crystallize it, no step is formed on the polysilicon film 29 in the regions B corresponding to the edges of the light-shielding film 40 even when the light-shielding film 40 is formed below the polysilicon film 29. Therefore, even when a polysilicon film 29 is formed by completely melting an amorphous silicon film by laser light L to perform a lateral crystal growth expanding in the scanning direction of the laser light L, the occurrence of step disconnection and film peel-off can be prevented on the polysilicon film 29 with certainty. As a result, it is possible to prevent lowering of the yield for the liquid crystal display device 50.

Next, an example of a method for manufacturing the liquid crystal display device 50 will be described. FIG. 27 through FIG. 30 are cross-sectional views showing a method for manufacturing a liquid crystal display device of Embodiment 3 of the present invention.

Base Coating Film Formation Step

Figure 27:
FIG. 27 is a cross-sectional view showing a method for manufacturing a liquid crystal display device of Embodiment 3 of the present invention.

First, as shown in FIG. 27, a base coating film 3 made of silicon oxide or the like is formed on a substrate 2, which is a glass substrate, a plastic substrate, or like substrate, by a CVD method, for example.

Figure 28:
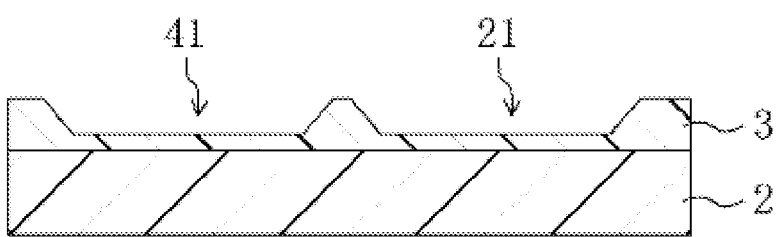
FIG. 28 is a cross-sectional view showing a method for manufacturing a liquid crystal display device of Embodiment 3 of the present invention.

Next, as shown in FIG. 28, the base coating film 3 is patterned by a photolithography method. After that, a concave part 21 for embedding a light-shielding film 28 and a concave part 41 for embedding a light-shielding film 40 are simultaneously formed by etching the base coating film 3 by a dry etching method. Here, the concave part 41 is formed in a tapered cross-sectional shape from the perspective of surely embedding the light-shielding film 40 in the concave part 41 by improving the coverage of the light-shielding film 40 in the concave part 41.

Light-Shielding Film Formation Step

Figure 29:
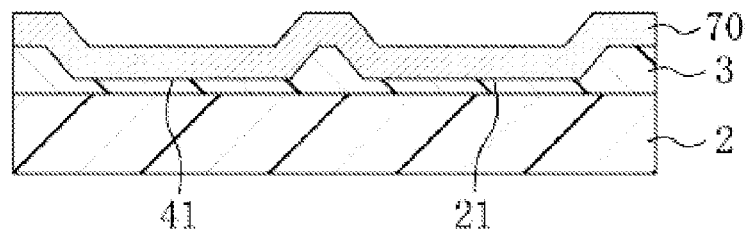
FIG. 29 is a cross-sectional view showing a method for manufacturing a liquid crystal display device of Embodiment 3 of the present invention.
Figure 30:
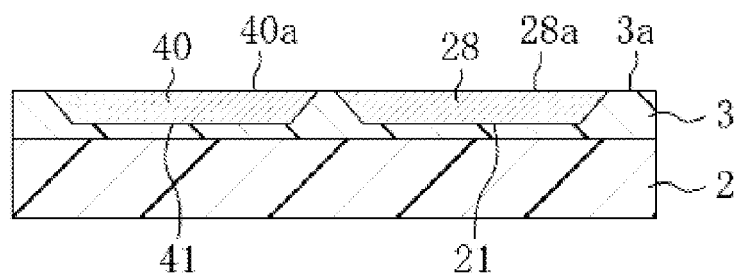
FIG. 30 is a cross-sectional view showing a method for manufacturing a liquid crystal display device of Embodiment 3 of the present invention.

Next, as shown in FIG. 29, a conductive film 70 is formed on the base coating film 3 by forming a metal material such as tungsten (W) into a film by a sputtering method or an anode oxidation method. After that, the conductive film 70 is patterned by a photo etching method, and then, as shown in FIG. 30, the light-shielding film 28 is formed in the concave part 21 formed in the base coating film 3, and the light-shielding film 40 is formed in the concave part 41. Here, as described above, the light-shielding film 28 is embedded and formed in the concave part 21 so that the surface 28a of the light-shielding film 28 on the semiconductor film 20 side and the surface 3a of the base coating film 3 on the semiconductor film 20 side are substantially flush with each other. The light-shielding film 40 is also embedded and formed in the concave part 41 so that the surface 40a of the light-shielding film 40 on the semiconductor film 5 side and the surface 3a of the base coating film 3 on the semiconductor film 5 side are substantially flush with each other.

After that, the steps same as FIG. 8 through FIG. 14 of Embodiment 1 described above are performed, and then the TFT substrate 1 shown in FIG. 25 is manufactured.

Then, by bonding the manufactured TFT substrate 1 and the opposite substrate 35 together with having a sealing member (not shown in the figures) and a liquid crystal layer (not shown in the figures) in between, the liquid crystal display device 50 shown in FIGS. 1(a) and 1(b) is manufactured.

According to the present embodiment described above, the following effects can be obtained in addition to the effects described above in (1) through (5).

(8) In the present embodiment, the semiconductor film 5 constitutes the active layer of the TFT 12. Therefore, lowering of the yield can be prevented especially for the liquid crystal display device 50 equipped with a light-shielding film 40 for preventing the increase in off-currents caused by the light entering to the channel region of the semiconductor film 5 by preventing light (for example, irradiated light from a backlight) from entering to the semiconductor film 5 that constitutes the active layer of the TFT 12.

(9) The present embodiment has a structure in which the concave part 41 for embedding the light-shielding film 40 is formed in a tapered cross-sectional shape. Accordingly, because the coverage of the light-shielding film 40 in the concave part 41 is improved, the light-shielding film 40 can be embedded in the concave part 41 with certainty.

Embodiment 4

Figure 31:
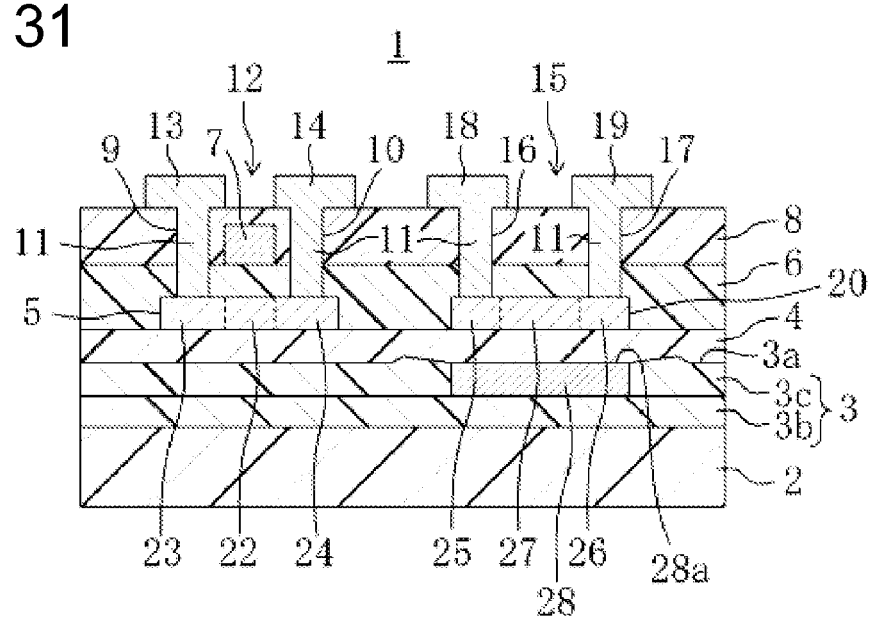
FIG. 31 is a cross-sectional view showing a schematic structure of a TFT substrate in a semiconductor device of Embodiment 4 of the present invention.
Figure 32:
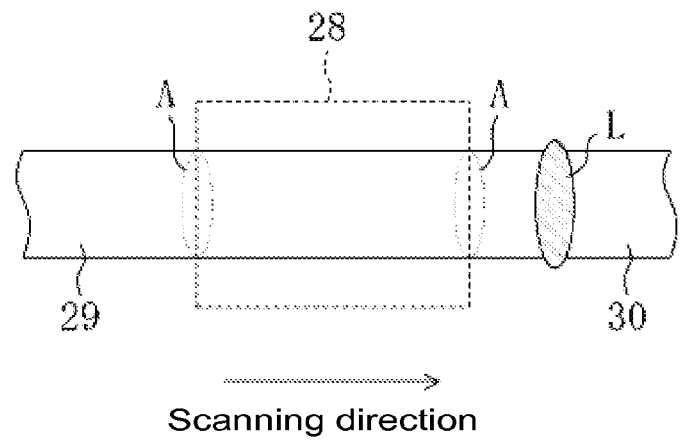
FIGS. 32(a) and 32(b) are views showing a polysilicon film formation step in a semiconductor device of Embodiment 4 of the present invention.
Figure 32:
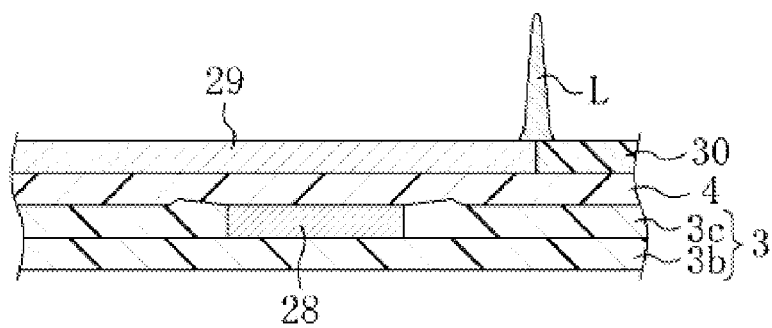

Next, Embodiment 4 of the present invention will be described. FIG. 31 is a cross-sectional view showing a schematic structure of a TFT substrate in a semiconductor device of Embodiment 4 of the present invention, and FIGS. 32(a) and 32(b) are views showing a polysilicon film formation step in a semiconductor device of Embodiment 4 of the present invention. Furthermore, the same reference numerals are used for the components that are similar to those of the above-mentioned Embodiment 1, and the description of them will be omitted. Moreover, the semiconductor device is similar to the one described in the above-mentioned Embodiment 1, and therefore, the detailed description of it will be omitted. A TFT that is an active element and a photodiode that is an optical sensor will be explained as examples for a semiconductor element, and a liquid crystal display device that includes a TFT and a photodiode will be explained as a semiconductor device in the present embodiment as well.

In the present embodiment, as shown in FIG. 31, unlike Embodiment 1 described above, a concave part 21 for embedding a light-shielding film 28 is not formed in a base coating film 3, but the light-shielding film 28 is embedded in the base coating film 3 so that the surface 28a of the light-shielding film 28 on the semiconductor film 20 side and the surface 3a of the base coating film 3 on the semiconductor film 20 side are substantially flush with each other. Further, although not shown in the figure, the TFT 12 may be a TFT with an LDD structure in which a low-concentration impurity region is formed between the channel region 22 and the source region 23 and between the channel region 22 and the drain region 24, respectively.

With such a structure, as shown in FIGS. 32(a) and 32(b), when a polysilicon film 29 that constitutes the semiconductor film 20 is formed by irradiating a non-crystalline silicon film such as an amorphous silicon film with laser light L to polycrystallize it, no step is formed on the polysilicon film 29 in the regions A corresponding to the edges of the light-shielding film 28 even when the light-shielding film 28 is formed below the polysilicon film 29. Therefore, even when the polysilicon film 29 is formed by completely melting an amorphous silicon film by laser light L to perform a lateral crystal growth expanding in the scanning direction of the laser light L, it is possible to prevent the occurrence of step disconnection and film peel-off on the polysilicon film 29 with certainty. As a result, it becomes possible to prevent lowering of the yield for the liquid crystal display device 50. It is also possible to surely prevent a step from forming on the semiconductor film 20 in the regions A corresponding to the edges of the light-shielding film 28.

Next, an example of a method for manufacturing the liquid crystal display device 50 will be described. FIG. 33 through FIG. 40 are cross-sectional views showing a method for manufacturing a liquid crystal display device of Embodiment 4 of the present invention.

Base Coating Film Formation Step

Figure 33:
FIG. 33 is a cross-sectional view showing a method for manufacturing a liquid crystal display device of Embodiment 4 of the present invention.

First, as shown in FIG. 33, a base coating film 3 (that is, a first base coating film 3*b*) made of silicon oxide or the like is formed on a substrate 2, which is a glass substrate, a plastic substrate, or like substrate, by a CVD method, for example.

Light-Shielding Film Formation Step

Figure 34:
FIG. 34 is a cross-sectional view showing a method for manufacturing a liquid crystal display device of Embodiment 4 of the present invention.
Figure 35:
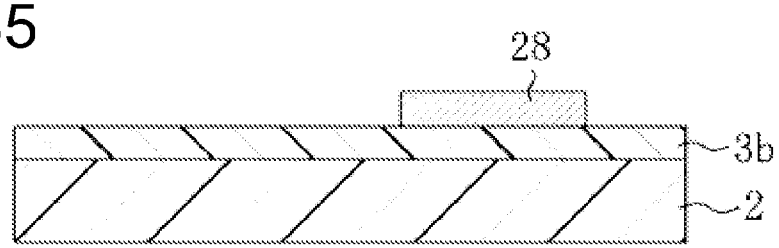
FIG. 35 is a cross-sectional view showing a method for manufacturing a liquid crystal display device of Embodiment 4 of the present invention.

Next, as shown in FIG. 34, a conductive film 70 is formed on the first base coating film 3*b* by forming a metal material such as tungsten (W) into a film by a sputtering method or an anode oxidation method. After that, by patterning the conductive film 70 by a photo etching method, a light-shielding film 28 is formed on the first base coating film 3*b* as shown in FIG. 35.

Figure 36:
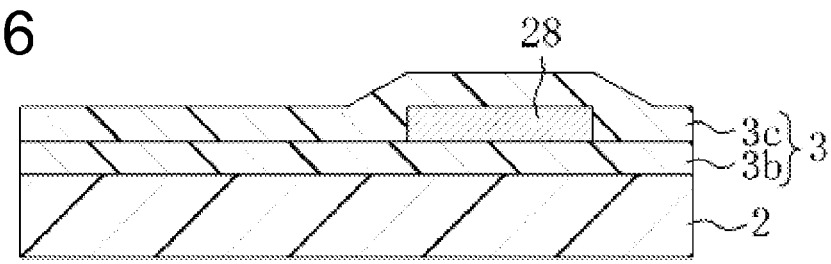
FIG. 36 is a cross-sectional view showing a method for manufacturing a liquid crystal display device of Embodiment 4 of the present invention.

Next, as shown in FIG. 36, a base coating film 3 (that is, a second base coating film 3*c*) made of silicon oxide or the like is formed again on the substrate 2 (that is, on the first base coating film 3*b*) by a CVD method, for example, so as to cover the light-shielding film 28. As a result, a double-layered base coating film 3 made of the base coating films 3*b* and 3*c* is formed.

Figure 37:
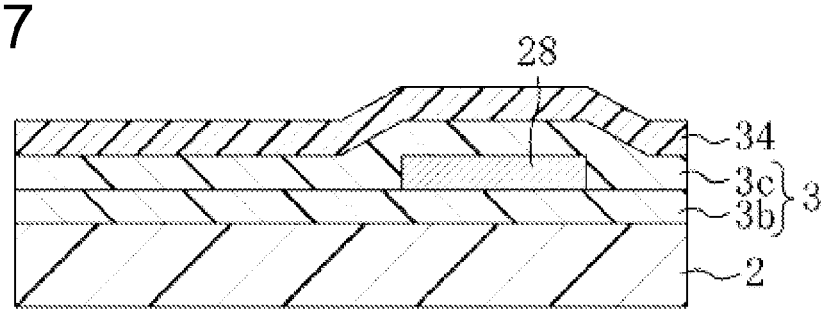
FIG. 37 is a cross-sectional view showing a method for manufacturing a liquid crystal display device of Embodiment 4 of the present invention.

Next, as shown in FIG. 37, by applying a resist on the base coating film 3 (that is, on the second base coating film 3*c*) by a spin coating method or the like, a negative-type resist 34 is formed.

Figure 38:
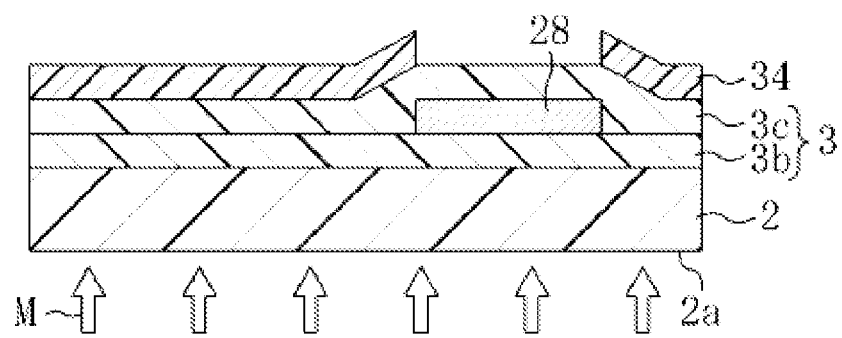
FIG. 38 is a cross-sectional view showing a method for manufacturing a liquid crystal display device of Embodiment 4 of the present invention.

Next, as shown in FIG. 38, exposure (a self-align exposure) is performed by irradiating light M from the rear surface 2*a* (that is, a surface of the substrate 2 opposite to the side facing the base coating film 3) side of the substrate 2 by using the light-shielding film 28 as a mask, and thereafter, development is performed. As a result, as shown in FIG. 38, the region above the light-shielding film 28 of the negative-type resist 34 is removed, and the region other than the region above the light-shielding film 28 remains. In other words, the part of the resist 34 located above the light-shielding film 28 on which no light is radiated is removed by development.

Figure 39:
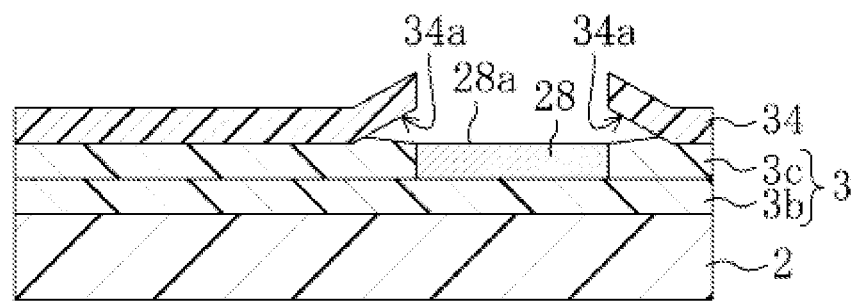
FIG. 39 is a cross-sectional view showing a method for manufacturing a liquid crystal display device of Embodiment 4 of the present invention.

Next, as shown in FIG. 39, the second base coating film 3*c* above the light-shielding film 28 is removed by performing wet etching on the base coating film 3 (that is, the second base coating film 3*c*) using the resist 34 formed on the base coating film 3 as a mask. Therefore, a surface 28*a* of the light-shielding film 28 that had been covered by the second base coating film 3*c* is now exposed.

Figure 40:
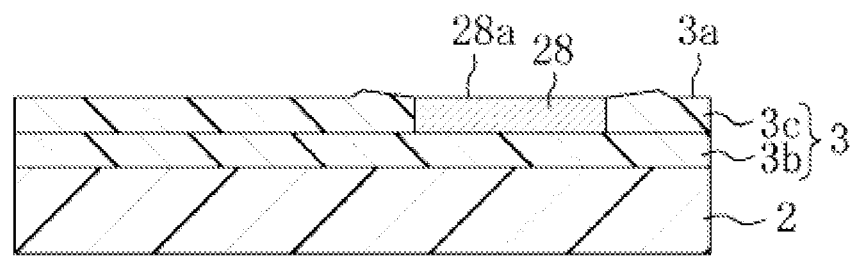
FIG. 40 is a cross-sectional view showing a method for manufacturing a liquid crystal display device of Embodiment 4 of the present invention.
Figure 41:
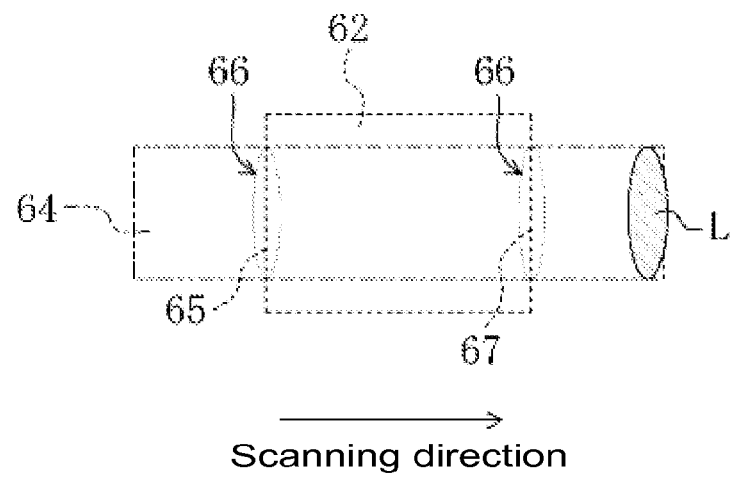
FIGS. 41(a) and 41(b) are views showing a polysilicon film formation step in a conventional liquid crystal display device.
Figure 41:
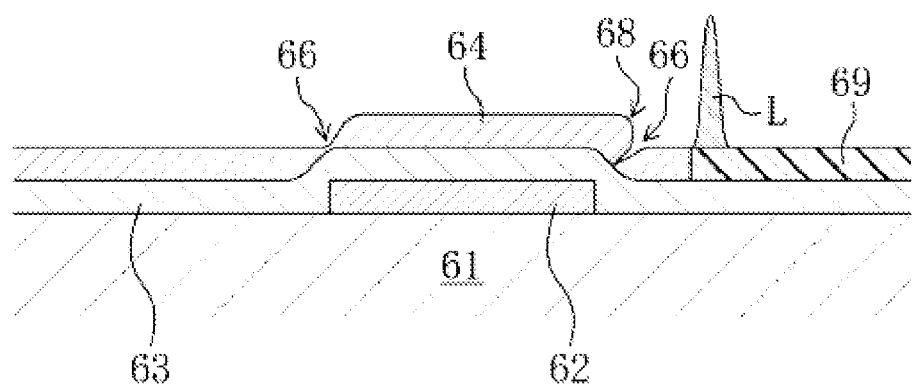

In this step, because the etching progresses isotropically in wet etching, the second base coating film 3*c* can be side-etched at the edges 34*a* of the resist 34. Accordingly, as shown in FIG. 39, with a simple method, it is possible to embed the light-shielding film 28 in the base coating film 3 so that the surface 28*a* of the light-shielding film 28 on the semiconductor film 20 side (the side facing the polysilicon film 29) and the surface 3*a* of the base coating film 3 (that is, the base coating film 3*c*) on the semiconductor film 20 side (the side facing the polysilicon film 29) are substantially flush with each other. Next, as shown in FIG. 40, the resist 34 is removed by ashing.

After that, the steps same as FIG. 8 through FIG. 14 of Embodiment 1 described above are performed, and the TFT substrate 1 shown in FIG. 31 is then manufactured.

Figure 1:
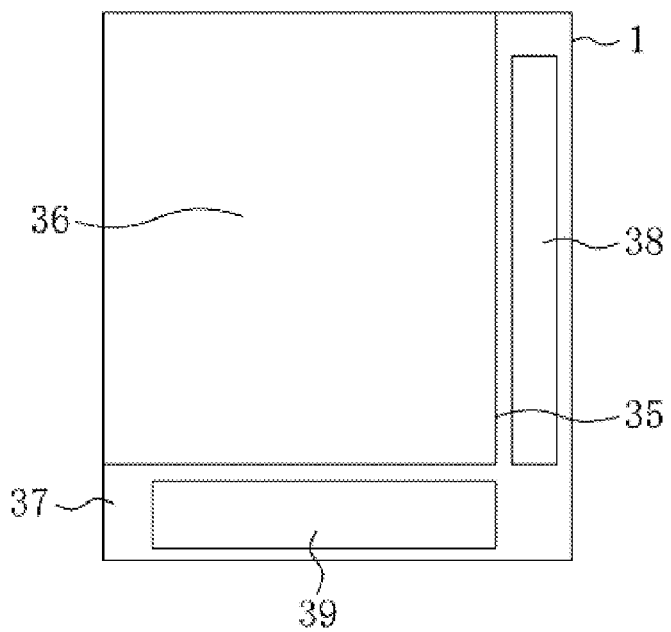
FIG. 1(a) is a schematic view showing a structure of a semiconductor device of Embodiment 1 of the present invention.
FIG. 1(b) is a cross-sectional view showing a structure of a semiconductor device according to Embodiment 1 of the present invention.
Figure 1:
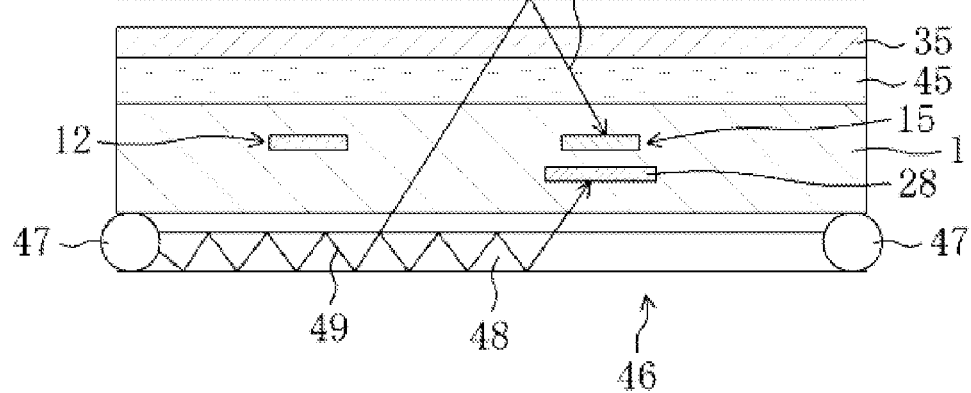

Then, by bonding the manufactured TFT substrate 1 and the opposite substrate 35 together with having a sealing member (not shown in the figures) and a liquid crystal layer (not shown in the figures) in between, the liquid crystal display device 50 shown in FIGS. 1(*a*) and 1(*b*) will be manufactured.

According to the present embodiment described above, the following effects can be obtained in addition to the effects described above in (1), (3) and (5).

(10) In the present embodiment, the light-shielding film 28 is embedded in the base coating film 3 so that the surface 28*a* of the light-shielding film 28 on the semiconductor film 20 side and the surface 3*a* of the base coating film 3 on the semiconductor film 20 side are substantially flush with each other. Therefore, it is possible to surely prevent a step from forming on the semiconductor film 20 in the regions A corresponding to the edges of the light-shielding film 28.

(11) In the present embodiment, the base coating film 3 for embedding the light-shielding film 28 is made of a plurality of layers (that is, the base coating films 3*b* and 3*c*). Therefore, unlike Embodiment 1 described above, there is no need to form the concave part 21, and the light-shielding film 28 can be embedded in the base coating film 3 with a simple structure.

(12) In the present embodiment, a negative-type resist is used as the resist 34. Therefore, by performing exposure from the surface 2*a* opposite to the base coating film 3 side of the substrate 2 using the light-shielding film 28 as a mask, the base coating film 3 that was formed again on the light-shielding film 28 can be exposed and developed by a self-alignment and removed by etching. Accordingly, it is possible to form the embedded light-shielding film 28 at a specific position with high accuracy.

(13) In the present embodiment, wet etching is used as the etching. Because the etching progresses isotropically, it is possible to embed the light-shielding film 28 in the base coating film 3 such that the surface 28*a* of the light-shielding film 28 on the polysilicon film 29 side and the surface 3*a* of the base coating film 3 on the polysilicon film 29 side are substantially flush with each other, using a simple method.

Furthermore, the above-mentioned embodiments may be modified as follows.

In the above-mentioned Embodiment 2 and Embodiment 3, the light-shielding films 28 and 40 are embedded in the concave parts 21 and 41. However, in both Embodiment 2 and Embodiment 3, the light-shielding films 28 and 40 may be formed by the light-shielding film formation step described in the above-mentioned Embodiment 4, instead of forming the concave parts 21 and 41 for embedding the light-shielding films 28 and 40.

That is, in the TFT substrate 1 of Embodiment 2 shown in FIG. 15, the light-shielding film 28 can be formed by the light-shielding film formation step described in the above-mentioned Embodiment 4, and the gate electrode 7 can be formed at the same time as the light-shielding film 28 is formed. Moreover, in the TFT substrate 1 of Embodiment 3 shown in FIG. 25, the light-shielding film 28 and the light-shielding film 40 can be formed by the light-shielding film formation step described in the above-mentioned Embodiment 4.

The above-mentioned embodiments may have a structure in which an organic film made of photosensitive acrylic resin is formed on an interlayer insulating film 8 by a spin coating method or the like.

In the above-mentioned embodiments, one photodiode 15 (or TFT 12) is formed above one light-shielding film 28 (or light-shielding film 40). However, the present invention is not limited to this structure, and it may have a structure in which a plurality of photodiodes (or a plurality of TFTs) are formed above one light-shielding film 28 (or the light-shielding film 40).

In the above-mentioned embodiments, the TFT 12 that has a top gate structure or a bottom gate structure was used as an example of a semiconductor element, but the semiconductor element of the present invention is not limited to these structures. For example, a TFT that has a double gate structure in which a semiconductor film is held between top and bottom two gate electrodes is also acceptable.

In the abovementioned embodiments, a liquid crystal display device was used as an example of a semiconductor device, but the present invention is not limited to this; for example, the present invention can also be applied to other semiconductor devices such as an organic EL display device in a similar way.

INDUSTRIAL APPLICABILITY

As described above, the present invention is useful for a semiconductor device such as a liquid crystal display device including a light-shielding film, and for a method for manufacturing the same.

DESCRIPTION OF REFERENCE CHARACTERS

1 TFT substrate
2 substrate
3 base coating film
3a surface of a base coating film on a semiconductor film side
3b first base coating film
3c second base coating film
4 base insulating film
5 semiconductor film
6 gate electrode
12 TFT (thin film transistor)
15 optical sensor
20 semiconductor film
21 concave part
28 light-shielding film
28a surface of a light-shielding film on a semiconductor film side
29 polysilicon film
30 silicon film
34 resist
40 light-shielding film
40a surface of a light-shielding film on a semiconductor film side
41 concave part
50 liquid crystal display device (semiconductor device)
L laser light

The invention claimed is:

1. A semiconductor device comprising:
a substrate;
a base coating film disposed over said substrate;
an insulating film disposed over said base coating film;
a semiconductor film disposed over said insulating film; and
a light-shielding film disposed below said semiconductor film,
wherein said light-shielding film is embedded in said base coating film,
wherein said base coating film includes a concave part for embedding said light-shielding film therein, said concave part not reaching a bottom of said base coating film,
wherein said light-shielding film is embedded in said concave part such that a surface of said light-shielding film on a side of said semiconductor film is substantially flush with a surface of said base coating film on a side of said semiconductor film, and
wherein said concave part is formed in a reverse tapered cross-sectional shape progressively widening towards said insulating film so that the light-shielding film embodied in said concave part also has a reversed tapered cross-sectional shape progressively widening towards said insulating film.

2. The semiconductor device according to claim 1, wherein said base coating film is made of a plurality of layers.

3. The semiconductor device according to claim 1, wherein said semiconductor film is a laterally-grown polysilicon film.

4. The semiconductor device according to claim 1, wherein said semiconductor film constitutes an optical sensor.

5. The semiconductor device according to claim 1, wherein said semiconductor film constitutes an active layer of a thin film transistor.

6. The semiconductor device according to claim 1, further comprising a gate electrode for a thin film transistor embedded in said base coating film.

* * * * *